United States Patent
Takeda et al.

(10) Patent No.: US 11,424,002 B2
(45) Date of Patent: Aug. 23, 2022

(54) MEMORY SYSTEM THAT INCLUDES A NAND FLASH MEMORY AND A MEMORY CONTROLLER

(71) Applicant: Kioxia Corporation, Tokyo (JP)

(72) Inventors: Naomi Takeda, Yokohama (JP); Ryo Yamaki, Yokohama (JP); Masanobu Shirakawa, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/158,161

(22) Filed: Jan. 26, 2021

(65) Prior Publication Data

US 2022/0093198 A1  Mar. 24, 2022

(30) Foreign Application Priority Data

Sep. 18, 2020  (JP) .............................. JP2020-157767

(51) Int. Cl.
| | | |
|---|---|---|
| *G11C 29/42* | (2006.01) | |
| *G11C 29/44* | (2006.01) | |
| *G11C 29/12* | (2006.01) | |
| *G11C 29/18* | (2006.01) | |
| *G11C 29/40* | (2006.01) | |

(52) U.S. Cl.
CPC ........ *G11C 29/42* (2013.01); *G11C 29/12005* (2013.01); *G11C 29/18* (2013.01); *G11C 29/40* (2013.01); *G11C 29/44* (2013.01)

(58) Field of Classification Search
CPC ... G11C 29/42; G11C 29/12005; G11C 29/18; G11C 29/30; G11C 29/44
See application file for complete search history.

(56) References Cited

U.S. PATENT DOCUMENTS

| | | | |
|---|---|---|---|
| 9,607,704 B2* | 3/2017 | Lin | ................. G11C 16/26 |
| 9,672,926 B2* | 6/2017 | Shiino | ................. G11C 11/5642 |
| 10,373,693 B2 | 8/2019 | Cha et al. | |
| 2013/0073924 A1* | 3/2013 | D'Abreu | ................. G11C 29/52 |
| | | | 714/763 |
| 2019/0278517 A1 | 9/2019 | Watanabe et al. | |
| 2020/0075106 A1 | 3/2020 | Tokutomi et al. | |
| 2020/0090763 A1 | 3/2020 | Tokutomi et al. | |
| 2021/0373813 A1* | 12/2021 | Sugahara | ................. G11C 16/26 |

FOREIGN PATENT DOCUMENTS

| | | |
|---|---|---|
| JP | 2020-35504 A | 3/2020 |
| JP | 2020-47318 A | 3/2020 |

* cited by examiner

*Primary Examiner* — Tuan T Nguyen
(74) *Attorney, Agent, or Firm* — Oblon, McClelland, Maier & Neustadt, L.L.P.

(57) ABSTRACT

According to one embodiment, a memory system includes a nonvolatile memory including a plurality of cell units, each of the plurality of cell units including a plurality of memory cells, and a memory controller. The memory controller is configured to: read first data from a first cell unit, using a first correction amount of a read voltage; identify an address of an error bit in the first data; update the first correction amount to a second correction amount, based on the first data and the address of the error bit of the first data; and read second data from a second cell unit different from the first cell unit, using a third correction amount based on the second correction amount.

15 Claims, 28 Drawing Sheets

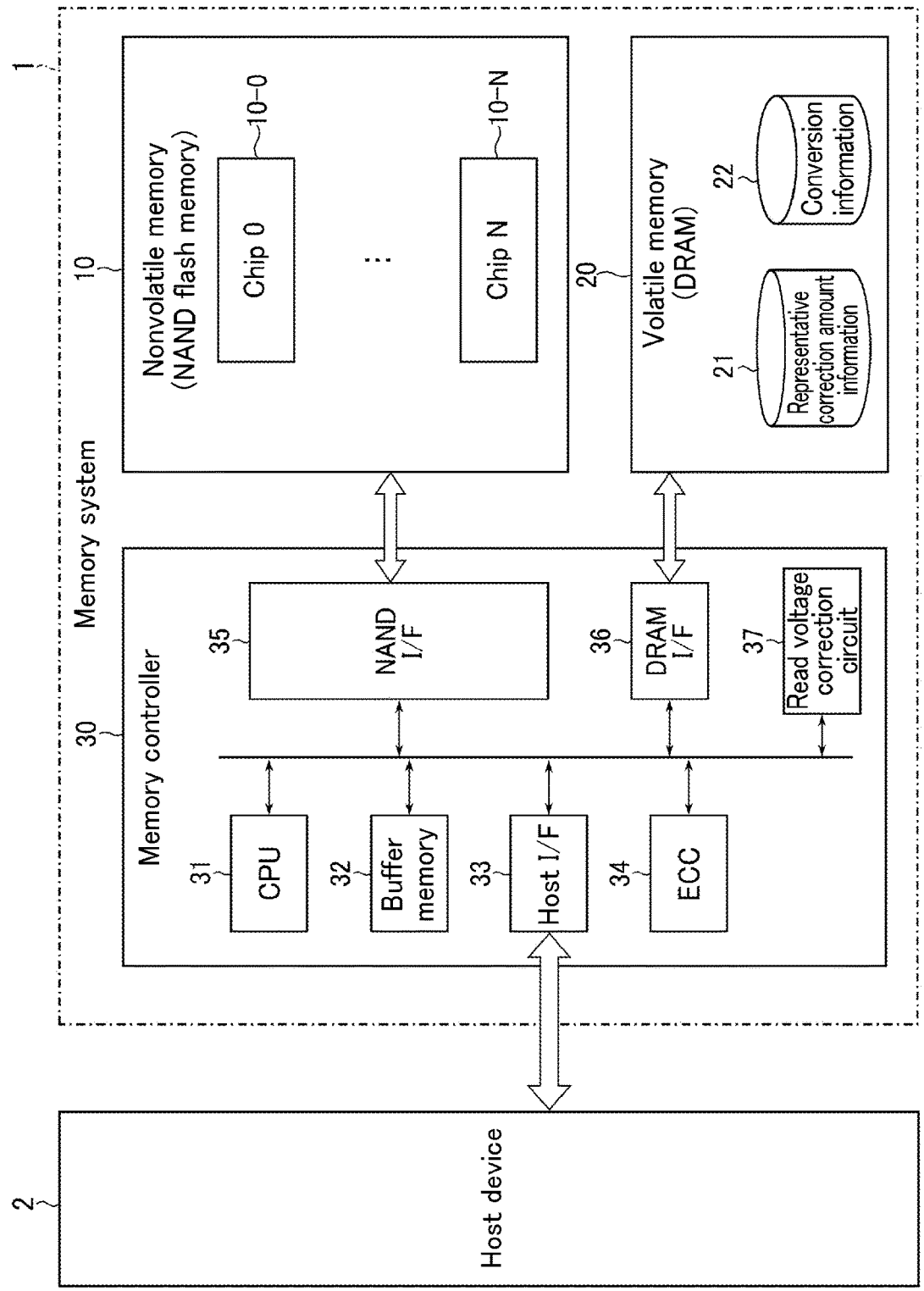
F I G. 1

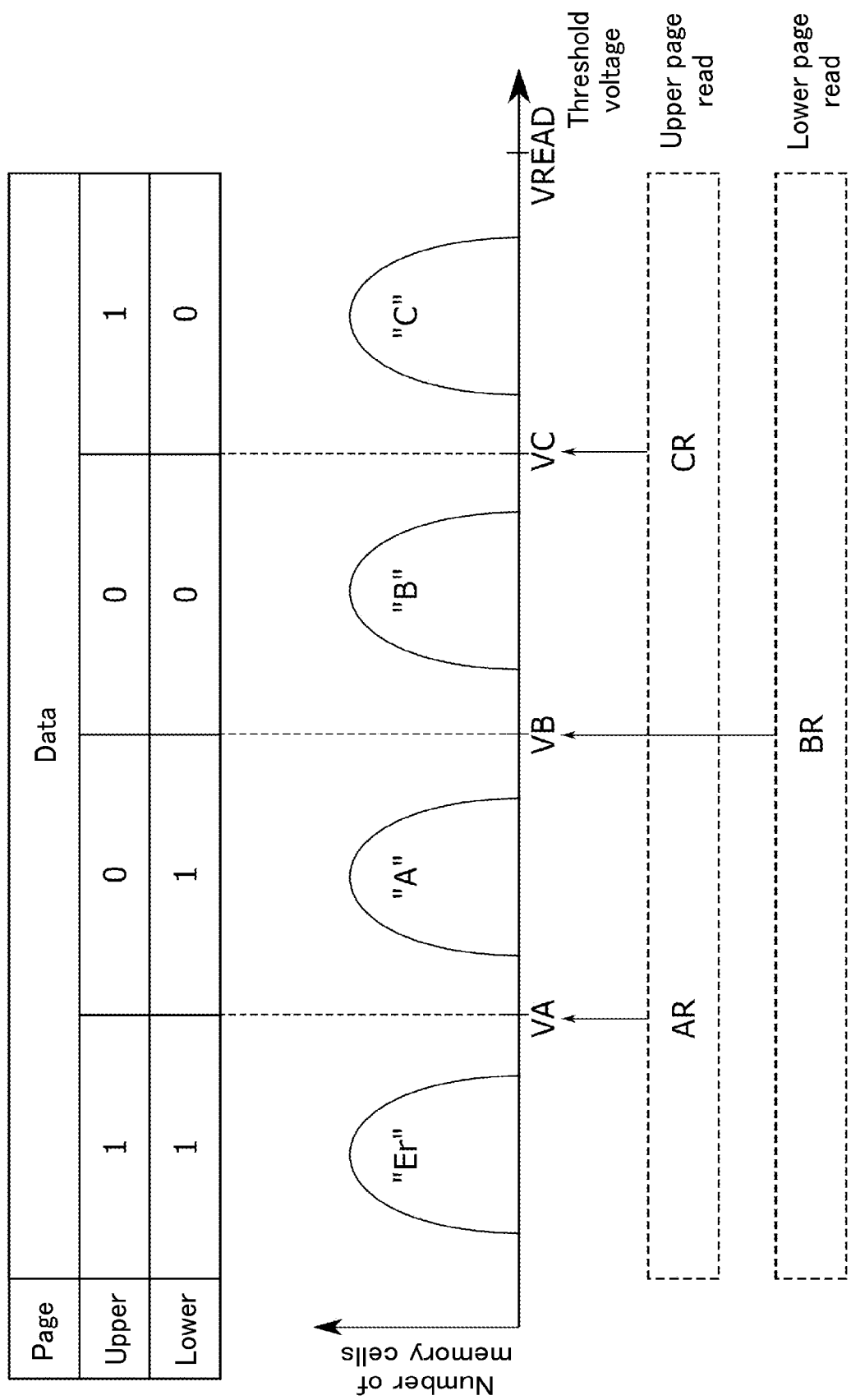
F I G. 4

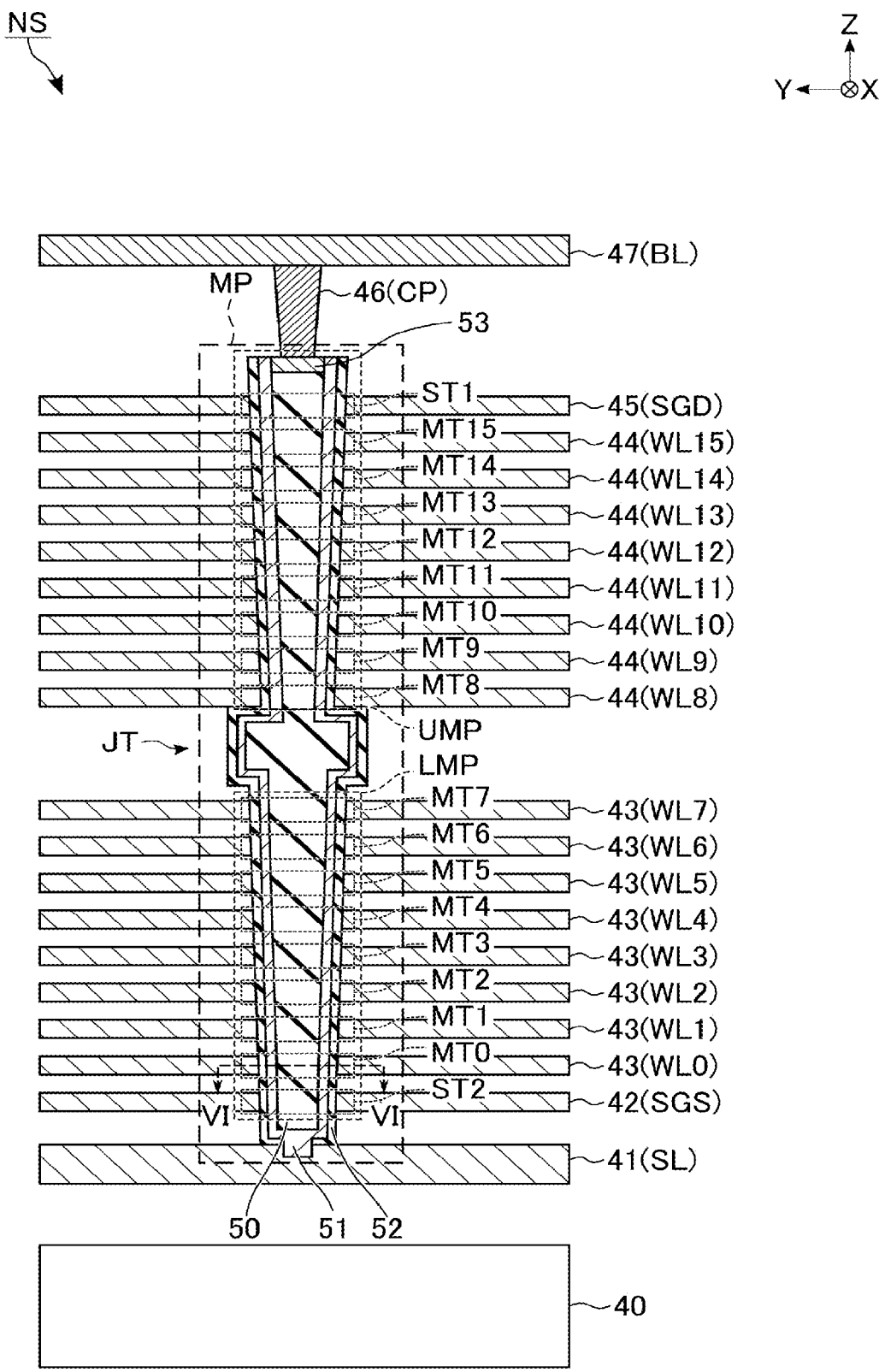
F I G. 5

| Chip | Block | Group | Representative correction amount (DAC value) | | |
|---|---|---|---|---|---|
| | | | AR | BR | CR |
| Chip0 | BLK0 | Gr0 | $\Delta$VA0 | $\Delta$VB0 | $\Delta$VC0 |
| | | Gr1 | $\Delta$VA1 | $\Delta$VB1 | $\Delta$VC1 |
| | | Gr2 | $\Delta$VA2 | $\Delta$VB2 | $\Delta$VC2 |
| | | Gr3 | $\Delta$VA3 | $\Delta$VB3 | $\Delta$VC3 |
| | | Gr4 | $\Delta$VA4 | $\Delta$VB4 | $\Delta$VC4 |
| | BLK1 | Gr0 | ⋮ | ⋮ | ⋮ |
| | | Gr1 | ⋮ | ⋮ | ⋮ |
| | | Gr2 | ⋮ | ⋮ | ⋮ |
| | | Gr3 | ⋮ | ⋮ | ⋮ |
| | | Gr4 | ⋮ | ⋮ | ⋮ |
| | ⋮ | ⋮ | ⋮ | ⋮ | ⋮ |
| Chip1 | ⋮ | ⋮ | ⋮ | ⋮ | ⋮ |
| ⋮ | ⋮ | ⋮ | ⋮ | ⋮ | ⋮ |

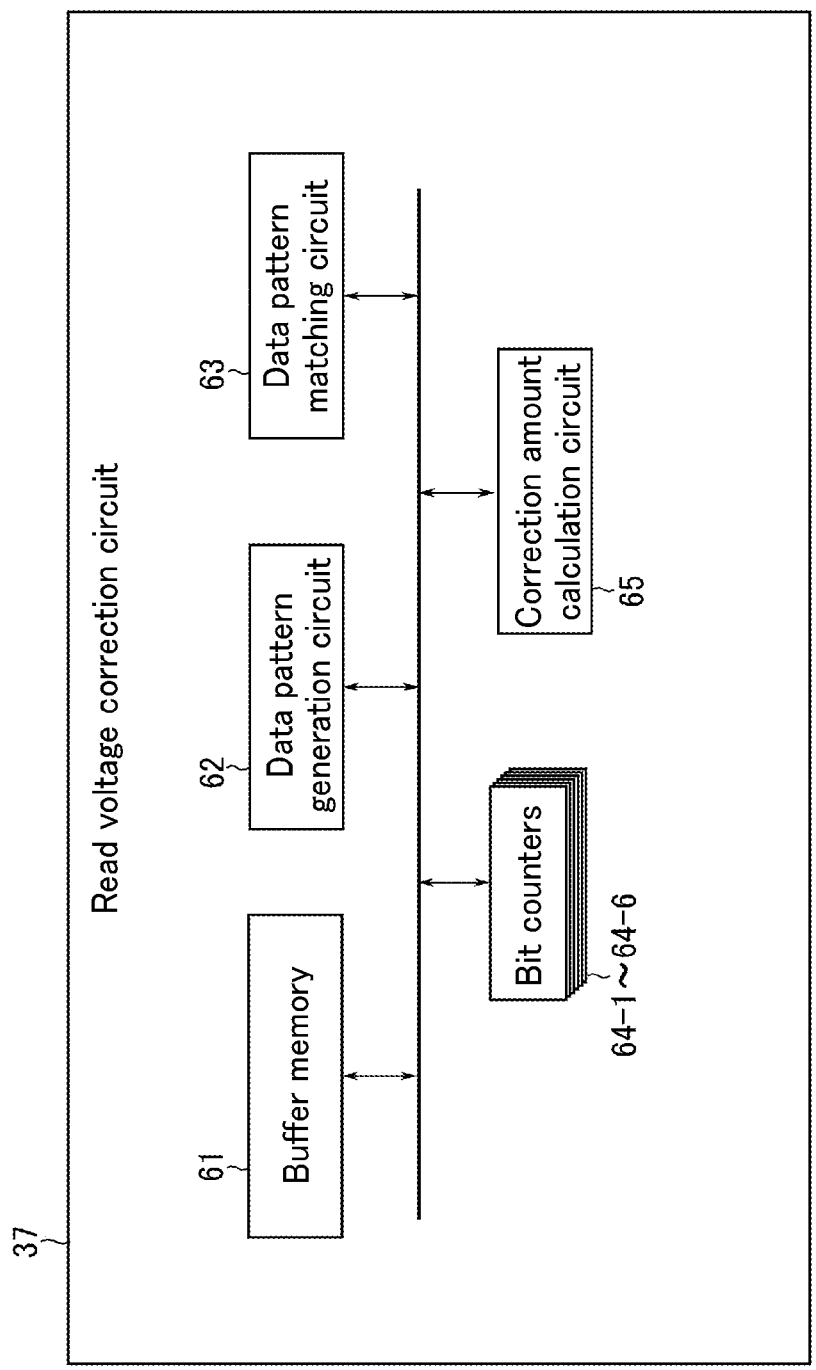
F I G. 9

21A

| Chip | Block | Group | Representative index |
|---|---|---|---|
| Chip0 | BLK0 | Gr0 | ID0 |
| | | Gr1 | ID1 |
| | | Gr2 | ID2 |
| | | Gr3 | ID3 |
| | | Gr4 | ID4 |
| | BLK1 | Gr0 | ⋮ |
| | | Gr1 | ⋮ |
| | | Gr2 | ⋮ |
| | | Gr3 | ⋮ |
| | | Gr4 | ⋮ |
| | ⋮ | ⋮ | ⋮ |
| Chip1 | ⋮ | ⋮ | ⋮ |
| ⋮ | ⋮ | ⋮ | ⋮ |

F I G. 16

23

| Index | Correction amount (DAC value) | | |
|---|---|---|---|
| | AR | BR | CR |
| ID0 | ΔVA0 | ΔVB0 | ΔVC0 |
| ID1 | ΔVA1 | ΔVB1 | ΔVC1 |
| ID2 | ΔVA2 | ΔVB2 | ΔVC2 |
| ID3 | ΔVA3 | ΔVB3 | ΔVC3 |
| ID4 | ΔVA4 | ΔVB4 | ΔVC4 |
| ⋮ | ⋮ | ⋮ | ⋮ |

F I G. 17

MEMORY SYSTEM THAT INCLUDES A NAND FLASH MEMORY AND A MEMORY CONTROLLER

CROSS-REFERENCE TO RELATED APPLICATIONS

This application is based upon and claims the benefit of priority from Japanese Patent Application No. 2020-157767, filed Sep. 18, 2020, the entire contents of which are incorporated herein by reference.

FIELD

Embodiments described herein relate generally to a memory system.

BACKGROUND

A memory system is known which includes a NAND flash memory serving as a nonvolatile memory and a memory controller controlling the nonvolatile memory.

BRIEF DESCRIPTION OF THE DRAWINGS

FIG. 1 is a block diagram illustrating a configuration of a memory system according to a first embodiment.

FIG. 4 is a schematic view illustrating threshold voltage distributions in the memory cell array according to the first embodiment.

FIG. 5 is a sectional view illustrating a configuration of a NAND string according to the first embodiment.

FIG. 8 is a conceptual diagram illustrating representative correction amount information of the memory system according to the first embodiment.

FIG. 9 is a block diagram illustrating a configuration of a read voltage correction circuit according to the first embodiment.

FIG. 16 is a conceptual diagram illustrating representative index information of the memory system according to the second embodiment.

FIG. 17 is a conceptual diagram illustrating a codebook of the memory system according to the second embodiment.

DETAILED DESCRIPTION

Figure 2:
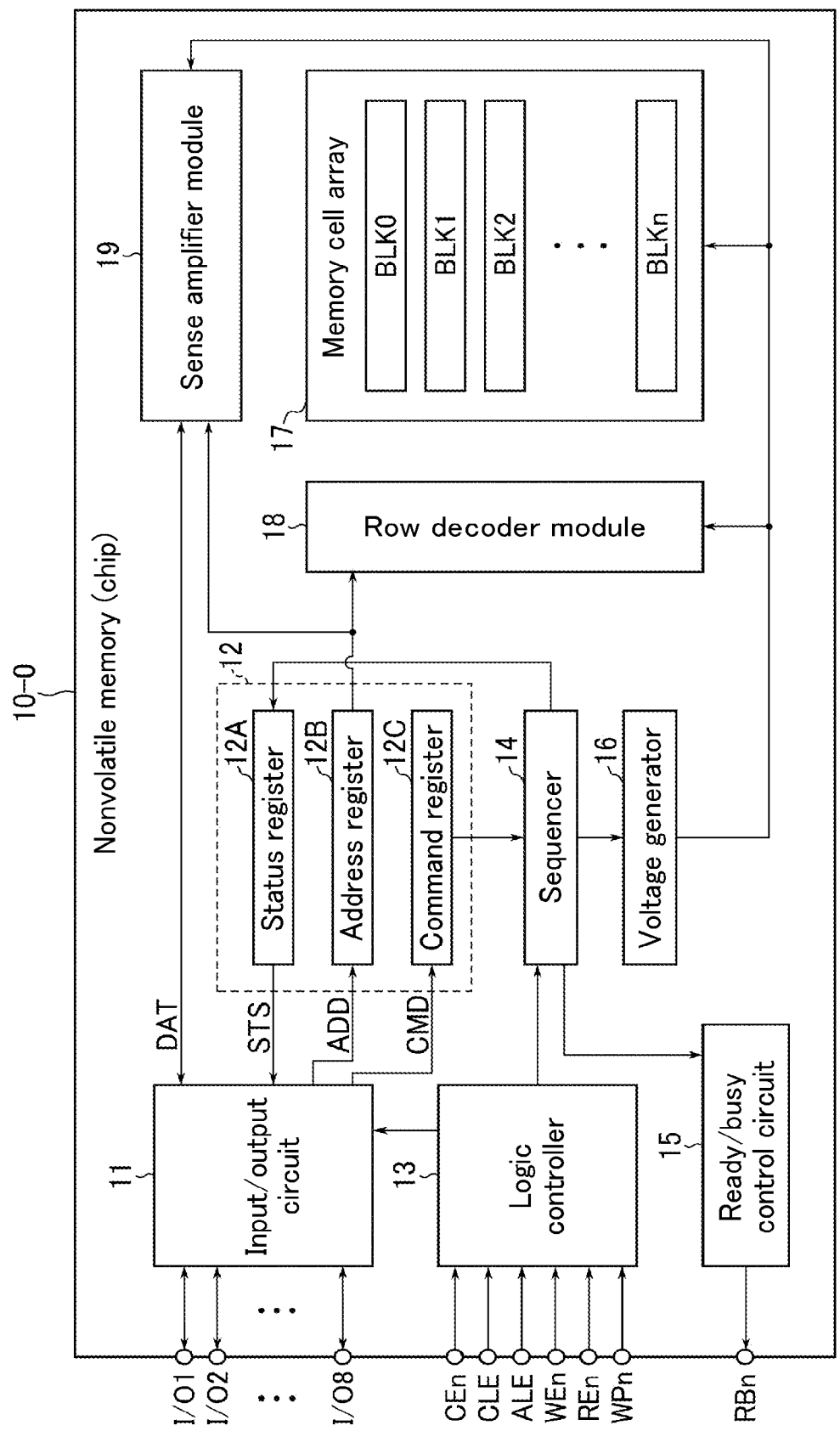
FIG. 2 is a block diagram illustrating a configuration of a nonvolatile memory according to the first embodiment.

In general, according to one embodiment, a memory system includes a nonvolatile memory including a plurality of cell units, each of the plurality of cell units including a plurality of memory cells, and a memory controller. The memory controller is configured to: read first data from a first cell unit, using a first correction amount of a read voltage; identify an address of an error bit in the first data; update the first correction amount to a second correction amount, based on the first data and the address of the error bit of the first data; and read second data from a second cell unit different from the first cell unit, using a third correction amount based on the second correction amount.

Embodiments will be described with reference to the accompanying drawings. In the descriptions below, structural elements having similar functions and configurations will be denoted by the same reference symbols. To distinguish a plurality of structural elements having common reference numerals, suffixes will be attached to the common reference numerals. If the structural elements do not have to be distinguished particularly, only the common reference numerals will be used, and no suffixes will be attached.

1. First Embodiment

An information processing system according to the first embodiment will be described.

1.1 Configuration

In the following, a description will be given of a memory system that includes a NAND flash memory serving as a nonvolatile memory.

1.1.1 Memory System

First, a configuration including the memory system will be described with reference to FIG. 1.

As shown in FIG. 1, the memory system 1 is coupled to an external host device 2 and can execute various operations in response to commands from the host device 2. The memory system 1 includes a nonvolatile memory 10, a volatile memory 20 and a memory controller 30. The nonvolatile memory 10, the volatile memory 20 and the memory controller 30 may constitute one semiconductor device, for example, by combining them together. Examples of such a semiconductor device include a memory card such as an SD™ card, a universal flash storage (UFS) and a solid state drive (SSD).

The nonvolatile memory 10 (hereinafter referred to as a NAND flash memory 10) includes, for example, a plurality of chips 10-0 to 10-N each including a plurality of memory cells (N is an integer of 1 or more). The nonvolatile memory 10 may include one chip, not limited to a case where the nonvolatile memory 10 includes a plurality of chips as shown in FIG. 1. The NAND flash memory 10 stores, in a nonvolatile manner, data to be written in accordance with an instruction of the host device 2. Further, the NAND flash memory 10 outputs data to be read in accordance with an instruction of the host device 2 to the host device 2 via the memory controller 30 (host read processing).

The volatile memory 20 (hereinafter referred to as a DRAM 20) is, for example, a dynamic random access memory (DRAM), and stores firmware for managing the NAND flash memory 10 and various management information. For example, the DRAM 20 stores representative correction amount information 21 and conversion information 22 as information for applying the result of patrol processing to host read processing.

The patrol processing is executed either regularly or irregularly in order to read the data stored in the NAND flash memory 10 with a small number of error bits. The patrol processing includes, for example, patrol read processing, and correction amount calculation processing for calculating a read voltage correction amount based on the result of the patrol read processing. The data read from the NAND flash memory 10 by the patrol read processing is not output to the host device 2. That is, the patrol read processing differs from the host read processing of reading the data to be output to the host device 2, in that the data read from the NAND flash memory 10 is not output to the host device 2. Details of the patrol processing will be described later.

The representative correction amount information 21 is information regarding the correction amount of a read voltage calculated based on the result of the patrol read processing. The representative correction amount information 21 includes information regarding the correction amount for a predetermined memory cell included among the memory cells of the NAND flash memory 10, and that information is used as a representative correction amount.

The conversion information 22 is information used in the conversion processing for applying the representative correction amount of the representative correction amount information 21 to memory cells other than the predetermined memory cell for which the representative correction amount is calculated.

The memory controller 30 includes a processor (CPU) 31, a buffer memory 32, a host interface circuit 33, an ECC circuit 34, a NAND interface circuit 35, a DRAM interface circuit 36 and a read voltage correction circuit 37. The undermentioned functions of the elements 31 to 36 of the memory controller 30 can be realized by either a hardware configuration or a combined configuration of hardware resources and firmware. Unless otherwise described, the read voltage correction circuit 37 can be realized by a hardware configuration that can function independently of the firmware.

The processor 31 controls the operation of the entire memory controller 30 by loading the program stored in the ROM (read only memory). For example, when the processor 31 receives a read request from the host device 2, the processor 31 executes read processing in response thereto. Similar operations are executed in the write processing and erase processing as well.

The buffer memory 32 is, for example, an SRAM (static random access memory), and temporarily stores data read from the NAND flash memory 10 by the memory controller 30, write data received from the host device 2, and the like.

The host interface circuit 33 is coupled to the host device 2 via a host bus and controls communications between the memory controller 30 and the host device 2. The host bus is, for example, a bus compliant with the SD™ interface, SAS (serial attached SCSI (small computer system interface)), SATA (serial ATA (advanced technology attachment)), PCIe™ (peripheral component interconnect express), or the like.

The ECC circuit 34 performs error detection processing and error correction processing for the data stored in the NAND flash memory 10. Specifically, at the time of data write, the ECC circuit 34 generates an error correcting code and adds it to the write data. At the time of data read, the ECC circuit 34 decodes the code to detect the presence or absence of an error bit. Where an error bit is detected, the column address (error position) of the error bit is specified, and error correction is executed. The methods of error correction include, for example, hard decision decoding (hard bit decoding) and soft decision decoding (soft bit decoding). As an example of a hard decision decoding code used for the hard decision decoding, a BCH (Bose-Chaudhuri-Hocquenghem) code, an RS (Reed-Solomon) code or the like can be used, and as an example of a soft decision decoding code used for the soft decision decoding, an LDPC (low density parity check) code or the like can be used.

The NAND interface circuit 35 is coupled to the NAND flash memory 10 via a NAND bus, and performs communications with the NAND flash memory 10. The NAND interface circuit 35 controls the transfer of data, commands and addresses between the memory controller 30 and the NAND flash memory 10, and independently controls each of the chips 10-0 to 10-N of the NAND flash memory 10. The NAND interface circuit 35 complies with the NAND interface standard.

The DRAM interface circuit 36 is coupled to the DRAM 20 and controls communications between the memory controller 30 and the DRAM 20. The DRAM interface circuit 36 complies with the DRAM interface standard.

The read voltage correction circuit 37 has a function of calculating a correction amount of the read voltage used when data is read from the NAND flash memory 10. Details of the configuration of the read voltage correction circuit 37 will be described later.

1.1.2 Chip

Next, a configuration of a chip of the NAND flash memory 10 will be described with reference to FIG. 2. In FIG. 2, the configuration of the chip 10-0 is shown as an example. Since the chips other than the chips 10-0 have a similar configuration to that of the chip 10-0, a description thereof will be omitted.

As shown in FIG. 2, the chip 10-0 includes, for example, an input/output circuit 11, a register set 12, a logic controller 13, a sequencer 14, a ready/busy control circuit 15, a voltage generator 16, a memory cell array 17, a row decoder module 18 and a sense amplifier module 19.

The input/output circuit 11 transmits and receives input/output signals I/O1 to I/O8 of e.g. 8-bit width to and from the memory controller 30. The input/output signal I/O may include data DAT, status information STS, an address ADD, a command CMD, and the like. Further, the input/output circuit 11 transmits and receives the data DAT to and from the sense amplifier module 19.

The register set 12 includes a status register 12A, an address register 12B and a command register 12C. The status register 12A, the address register 12B and the command register 12C store the status information STS, the address ADD and the command CMD, respectively.

The status information STS is updated based on, for example, the operating state of the sequencer 14. The status information STS is transferred from the status register 12A to the input/output circuit 11 based on an instruction supplied from the memory controller 30, and is output to the memory controller 30. The address ADD is transferred from the input/output circuit 11 to the address register 12B. The address ADD may include, for example, a chip address, a block address, a page address, a column address, and the like. The command CMD is transferred from the input/output circuit 11 to the command register 12C. The command CMD includes instructions related to the operations of the chip 10-0.

The logic controller 13 controls the input/output circuit 11 and the sequencer 14, based on control signals received from the memory controller 30. As those control signals, for example, a chip enable signal CEn, a command latch enable signal CLE, an address latch enable signal ALE, a write enable signal WEn, a read enable signal REn and a write protection signal WPn are used.

The chip enable signal CEn is a signal for enabling the chip 10-0. The command latch enable signal CLE is a signal for notifying the input/output circuit 11 that the received input/output signal I/O is the command CMD. The address latch enable signal ALE is a signal for notifying the input/output circuit 11 that the received input/output signal I/O is the address ADD. The write enable signal WEn is a signal for instructing the input/output circuit 11 to receive the input/output signal I/O. The read enable signal REn is a signal for instructing the input/output circuit 11 to output the input/output signal I/O. The write protection signal WPn is a signal for setting the chip 10-0 in a protected state when the power is turned on and off.

The sequencer 14 controls the overall operation of the chip 10-0. For example, the sequencer 14 executes read processing, write processing, erase processing, etc., based on the command CMD stored in the command register 12C and the address ADD stored in the address register 12B.

The ready/busy control circuit 15 generates a ready/busy signal RBn, based on the operating state of the sequencer 14. The ready/busy signal RBn is a signal for notifying the memory controller 30 whether the chip 10-0 is in a ready state or in a busy state. In the present specification, the "ready state" indicates that the chip 10-0 is in a state in which an instruction from the memory controller is accepted, while the "busy state" indicates that the chip 10-0 is in a state in which an instruction from the memory is not accepted.

The voltage generator 16 generates voltages that are used in read processing, write processing, erase processing, etc.

The voltage generator 16 supplies the generated voltages to the memory cell array 17, the row decoder module 18 and the sense amplifier module 19.

The memory cell array 17 includes a plurality of blocks BLK0 to BLKn (n is an integer of 1 or more). The block BLK is an aggregation of memory cell transistors capable of storing data in a nonvolatile manner, and is used, for example, as a unit of data erasure. Each memory cell transistor is associated with one bit line BL and one word line WL.

Based on the block address, the row decoder module 18 selects a block BLK for which various operations are to be executed. The row decoder module 18 transfers the voltage supplied from the voltage generator 16 to the word line WL etc. of the selected block BLK.

In the read processing, the sense amplifier module 19 reads data from the memory cell array 17 and transfers the read data to the input/output circuit 11. In the write processing, the sense amplifier module 19 applies a predetermined voltage to the bit line BL, based on the data received from the input/output circuit 11.

1.1.3 Memory Cell Array

Next, a description will be given of a configuration of the memory cell array included in the chip of the nonvolatile memory according to the first embodiment.

1.1.3.1 Circuit Configuration

Figure 3:
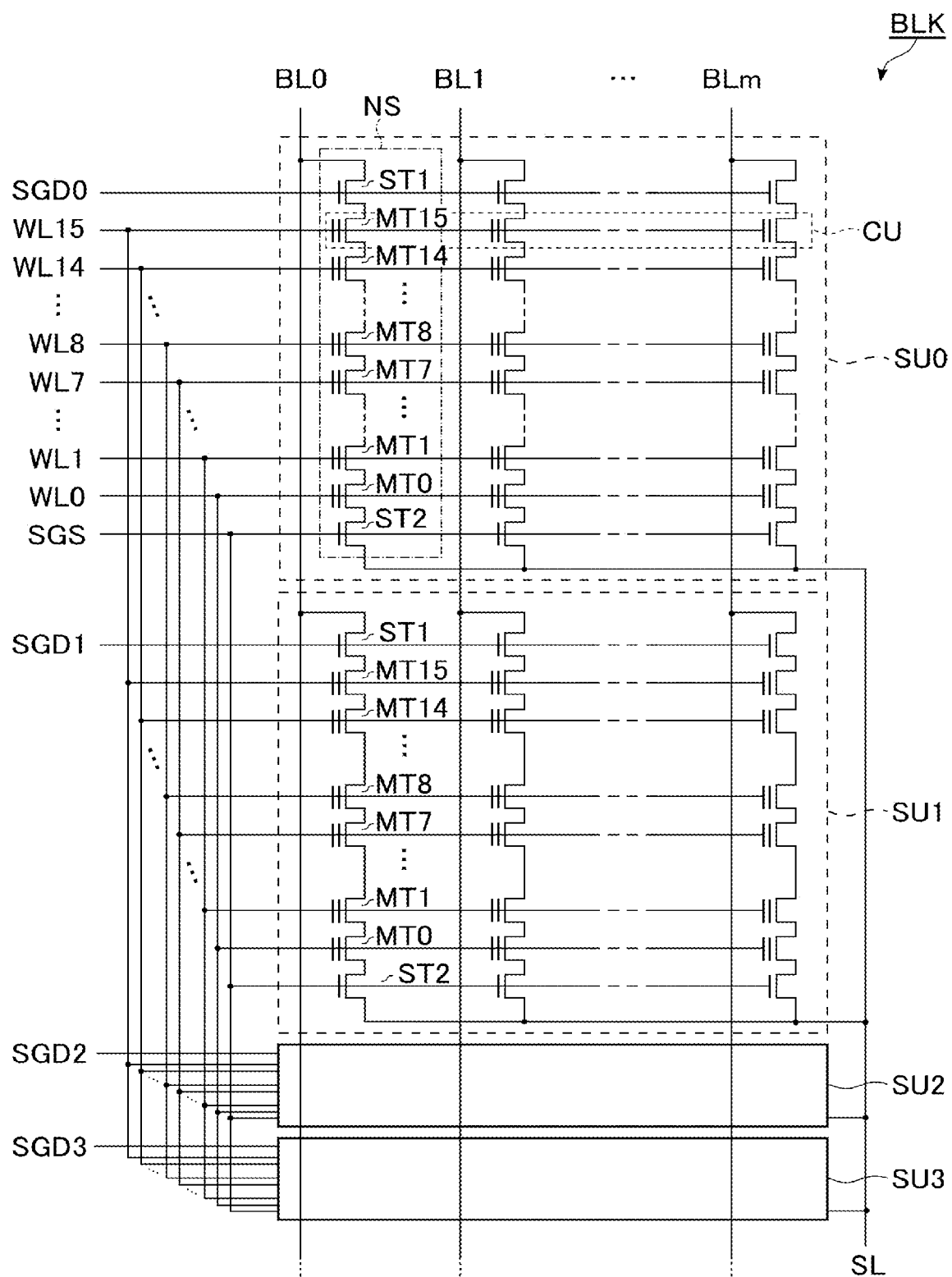
FIG. 3 is a circuit diagram illustrating a configuration of a memory cell array according to the first embodiment.

FIG. 3 is an example of a circuit diagram showing the configuration of the memory cell array according to the first embodiment. In FIG. 3, one block BLK of the memory cell array 17 is extracted and shown. As shown in FIG. 3, the block BLK includes, for example, four string units SU0 to SU3. In FIG. 3, the configurations of the string units SU2 and SU3 are shown in a simplified manner.

Each string unit SU includes a plurality of NAND strings NS respectively associated with bit lines BL0 to BLm (m is an integer of 1 or more). The NAND string NS includes, for example, memory cell transistors MT0 to MT15 and select transistors ST1 and ST2.

Each of the memory cell transistors MT includes a control gate and a charge storage layer, and stores data in a nonvolatile manner. Each of the select transistors ST1 and ST2 is used for selecting a string unit SU during various operations.

In each NAND string NS, the memory cell transistors MT0 to MT15 are coupled in series. The select transistor ST1 is coupled between one end of the memory cell transistors MT0 to MT15 coupled in series and the associated bit line BL. The drain of the select transistor ST2 is coupled to the other end of the memory cell transistors MT0 to MT15 coupled in series. The source of the select transistor ST2 is coupled to the source line SL.

In the same block BLK, the gates of the plurality of select transistors ST1 included in the string units SU0 to SU3 are commonly coupled to the select gate lines SGD0 to SGD3, respectively. The control gates of the plurality of memory cell transistors MT0 to MT15 are commonly coupled to the word lines WL0 to WL15, respectively. The gates of the plurality of select transistors ST2 are commonly coupled to the select gate line SGS.

The bit lines BL0 to BLm are shared by a plurality of blocks BLK. The same bit line BL is coupled to the NAND strings NS corresponding to the same column address. Each of the word lines WL0 to WL15 is provided for each block BLK. The source line SL is shared, for example, by a plurality of blocks BLK.

A set of the memory cell transistors MT coupled to a common word line WL in one string unit SU are referred to as a cell unit CU, for example, and are used as a data write unit. For example, the storage capacity of the cell unit CU including memory cell transistors MT each storing 1-bit data is defined as "1 page data." The one-page data is used, for example, as a data read unit. The cell unit CU may have a storage capacity of two page data or more, in accordance with the number of bits of data stored in the memory cell transistor MT.

The above-mentioned circuit configuration of the memory cell array 17 is merely an example, and is not limited thereto. For example, the number of string units SU included in each block BLK may be designed to be any number. The numbers of memory cell transistors MC and select transistors ST1 and ST2 included in each NAND string NS may be designed to be any numbers.

In the present embodiment, one memory cell transistor MT can store, for example, 2-bit data. That is, the memory cell transistor MT of the present embodiment is an MLC (multi level cell) that stores 2-bit data. The 2-bit data stored in the memory cell transistor of the MLC (multi level cell) will be referred to as a lower bit and an upper bit, in order from the lower bit. A set of lower bits stored in the memory cell transistors MT included in the same cell unit CU will be called a lower page, and a set of upper bits will be called an upper page.

FIG. 4 is a schematic diagram illustrating threshold distributions of the memory cell transistors MT of the memory cell array 17.

As shown in FIG. 4, where the memory cell transistor MT stores 2-bit data, the threshold voltages have four distributions. These four threshold voltage distributions will be referred to as an "Er" state, an "A" state, a "B" state and a "C" state in the ascending order of threshold voltage.

Voltages VA, VB and VC shown in FIG. 4 are used to distinguish between the two states adjacent in the read processing. A voltage VREAD is a voltage applied to the non-selected word lines during the read processing. When the voltage VREAD is applied to the gate, the memory cell transistor MT is turned on regardless of the data stored therein. The relationships among these voltage values are VA<VB<VC<VREAD.

Of the above-mentioned threshold voltage distributions, the "Er" state corresponds to the erased state of the memory cell transistor MT. The threshold voltage in the "Er" state is lower than the voltage VA. The threshold voltage in the "A" state is equal to or higher than the voltage VA and is lower than the voltage VB. The threshold voltage in the "B" state is equal to or higher than the voltage VB and is lower than the voltage VC. The threshold voltage in the "C" state is equal to or higher than the voltage VC and is lower than the voltage VREAD.

The above-mentioned four threshold voltage distributions are formed by writing 2-bit (2-page) data including the lower bit and the upper bit. The four threshold voltage distributions correspond to different 2-bit data. In the present embodiment, data is assigned to the "upper bit/lower bit" of the memory cell transistor MT in each state, as shown below.

The memory cell transistor MT in the "Er" state stores "11" data. The memory cell transistor MT in the "A" state stores "01" data. The memory cell transistor MT in the "B" state stores "00" data. The memory cell transistor MT in the "C" state stores "10" data.

When the lower page is read, the voltage VB that distinguishes between the "A" state and the "B" state is used as the read voltage. The read operation using the voltage VB is called read processing BR.

When the upper page is read, the voltage VA that distinguishes between the "Er" state and the "A" state, and the voltage VC that distinguishes between the "B" state and the "C" state are used as read voltages. The read operation using the voltage VA is called read processing AR, and the read operation using the voltage VC is called read processing CR.

1.1.3.2 Sectional Configuration

FIG. 5 is a sectional view of the NAND string NS, which is a partial region of the block BLK. As shown in FIG. 5, the memory pillar MP formed above the semiconductor substrate 40 is used as a NAND string NS.

In the sectional views referred to below, the X-axis corresponds to the extending direction of the word lines WL, the Y-axis corresponds to the extending direction of the bit lines BL, and the Z-axis corresponds to the extending direction of the NAND string NS with respect to the semiconductor substrate 40. In the sectional views, illustration of such components as insulating layers (interlayer insulating films) is omitted where appropriate to make the views easy to see.

The memory pillar MP formed above the semiconductor substrate 40 (in the arrow direction of the Z-axis) is used as the NAND string NS.

A conductive layer 41 is provided above the semiconductor substrate 40, with an insulating layer (not shown) interposed. Peripheral circuits such as a sense amplifier module 19 may be provided on the insulating layer. The conductive layer 41 is formed, for example, as a plate spreading in the XY plane, and is used as a source line SL.

A conductive layer 42 is provided above conductive layer 41, with an insulating layer (not shown) interposed. The conductive layer 42 is used as a select gate line SGS.

Insulating layers (not shown) and conductive layers 43 are alternately stacked a plurality of times (eight times in FIG. 4) above the conductive layer 42. The plurality of stacked conductive layers 43 are respectively used as word lines WL0 to WL7 in order from the semiconductor substrate 40.

Insulating layers (not shown) and conductive layers 44 are alternately stacked a plurality of times (eight times in FIG. 4) above the uppermost one of the conductive layers 43. The plurality of stacked conductive layers 44 are respectively used as word lines WL8 to WL 15 in order from the semiconductor substrate 40. The distance between the uppermost conductive layer 43 and the lowermost conductive layer 44 is larger than, for example, the distance between the adjacent conductive layers 43 or the distance between the adjacent conductive layers 44.

A conductive layer 45 is provided above the uppermost conductive layer 44, with an insulating layer (not shown) interposed. The conductive layer 45 is used as a select gate line SGD. The conductive layers 42 to 45 are formed, for example, as plates spreading in the XY plane.

A plurality of conductive layers 47 are provided above the conductive layer 45, with an insulating layer (not shown) interposed. The conductive layers 47 extend along the Y axis. Each of the plurality of conductive layers 47 is linear, is arranged along the X axis, and is used as a bit line BL.

The memory pillar MP extends along the Z axis, passes through the conductive layers 42 to 45, and the bottom portion thereof is in contact with the conductive layer 41. The memory pillar MP includes a lower pillar LMP, an upper pillar UMP formed above the lower pillar LMP, and a joint portion JT that electrically couples the lower pillar LMP and the upper pillar UMP. The lower pillar LMP and the upper pillar UMP have, for example, a tapered shape whose diameter increases from the semiconductor substrate 40 toward the bit line BL (along the Z axis). The diameter of the joint portion JT along an XY plane is larger than, for example, the diameters which the lower pillar LMP and upper pillar UMP have at their contact portions with the joint portion JT.

The memory pillar MP includes, for example, a core film 50, a semiconductor film 51, a laminated film 52 and a semiconductor portion 53. Each of the core film 50, semiconductor film 51 and laminated film 52 is formed, for example, as a continuous film in the lower pillar LMP, joint portion JT and upper pillar UMP.

Specifically, the core film 50 is provided substantially in the center of the memory pillar MP and extends along the Z axis. The core film 50 has, for example, an upper end located above the conductive layer 45 and a lower end located below the conductive layer 42. The core film 50 includes an insulator such as silicon nitride ($SiO_2$).

The semiconductor film 51 includes a cylindrical portion that covers the bottom surface and side surface of the core film 50 and that is formed along the Z axis. The semiconductor film 51 has, for example, an upper end located above the conductive layer 45 and a lower end in contact with the conductive layer 41. The semiconductor film 51 contains, for example, polysilicon.

The laminated film 52 includes a cylindrical portion that covers the side surface of the semiconductor film 51 and that is formed along the Z axis. Details of the structure of the laminated film 52 will be described with reference to FIG. 6, which is a sectional view taken along line VI-VI in FIG. 5.

Figure 6:
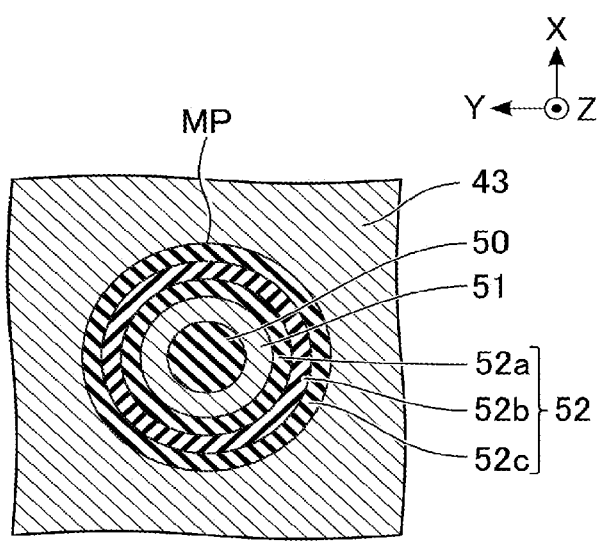
FIG. 6 is a sectional view of a memory cell transistor taken along line VI-VI shown in FIG. 5.

As shown in FIG. 6, the laminated film 52 includes a tunnel insulating film 52a, a charge storage film 52b and a block insulating film 52c. The tunnel insulating film 52a covers the side surface of the semiconductor film 51, and the charge storage film 52b covers the side surface of the tunnel insulating film 52a. The block insulating film 52c covers the side surface of the charge storage film 52b and is covered with the conductive layer 43.

Turning back to FIG. 5, a configuration of the memory pillar MP will be described. The semiconductor portion 53 covers the upper surface of the core film 50 and is in contact with that portion of the semiconductor film 51 which is located above the core film 50. The semiconductor portion 53 is, for example, cylindrical and is located at the upper end of the upper pillar UMP.

A conductive layer 46 is provided between the upper surface of the semiconductor portion 53 and the lower surface of the conductive layer 47. The conductive layer 46 is used as a contact CP that electrically couples the memory pillar MP and the bit line BL.

In the configuration of the memory pillar MP described above, the intersection between the memory pillar MP and the conductive layer 42 functions as a select transistor ST2. The intersections between the memory pillar MP and the conductive layers 43 function as select transistors MT0 to MT7, respectively. The intersections between the memory pillar MP and the conductive layers 44 function as select transistors MT8 to MT15, respectively. The intersection between the memory pillar MP and the conductive layer 45 functions as the select transistor ST1. The semiconductor film 51 functions as channels of the memory cell transistors MT and as channels of the select transistors ST1 and ST2.

With the above configuration, the memory pillar MP can function as a NAND string NS. The memory cell array 17 is formed by arranging a plurality of memory pillars MP above the semiconductor substrate 40.

1.1.3.3 Grouping of Cell Units

Next, a description will be given of a grouping of cell units CU in the block BLK.

As described above, the memory cell transistors MT0 to MT15 coupled in series in the NAND string NS are stacked along the Z axis, so that the memory cell transistors MT0 to MT15 have different shapes depending on the positions (heights) along the Z axis. Therefore, the memory cell transistors MT0 to MT15 can have electrical characteristics different from each other. Further, the end portions of the upper pillar UMP are electrically coupled to the bit line BL and the upper end of the joint portion JT, respectively, so that the end portions of the upper pillar UMP can have electrical characteristics different from the central portion thereof. The end portions of the lower pillar LMP are electrically coupled to the source line SL and the lower end of the joint portion JT, respectively, so that the end portions of the lower pillar LMP can have electrical characteristics different from the central portion thereof. Therefore, by grouping cell units CU having similar electrical characteristics into one group, the cell units CU in the block BLK can be classified into several groups.

Figure 7:
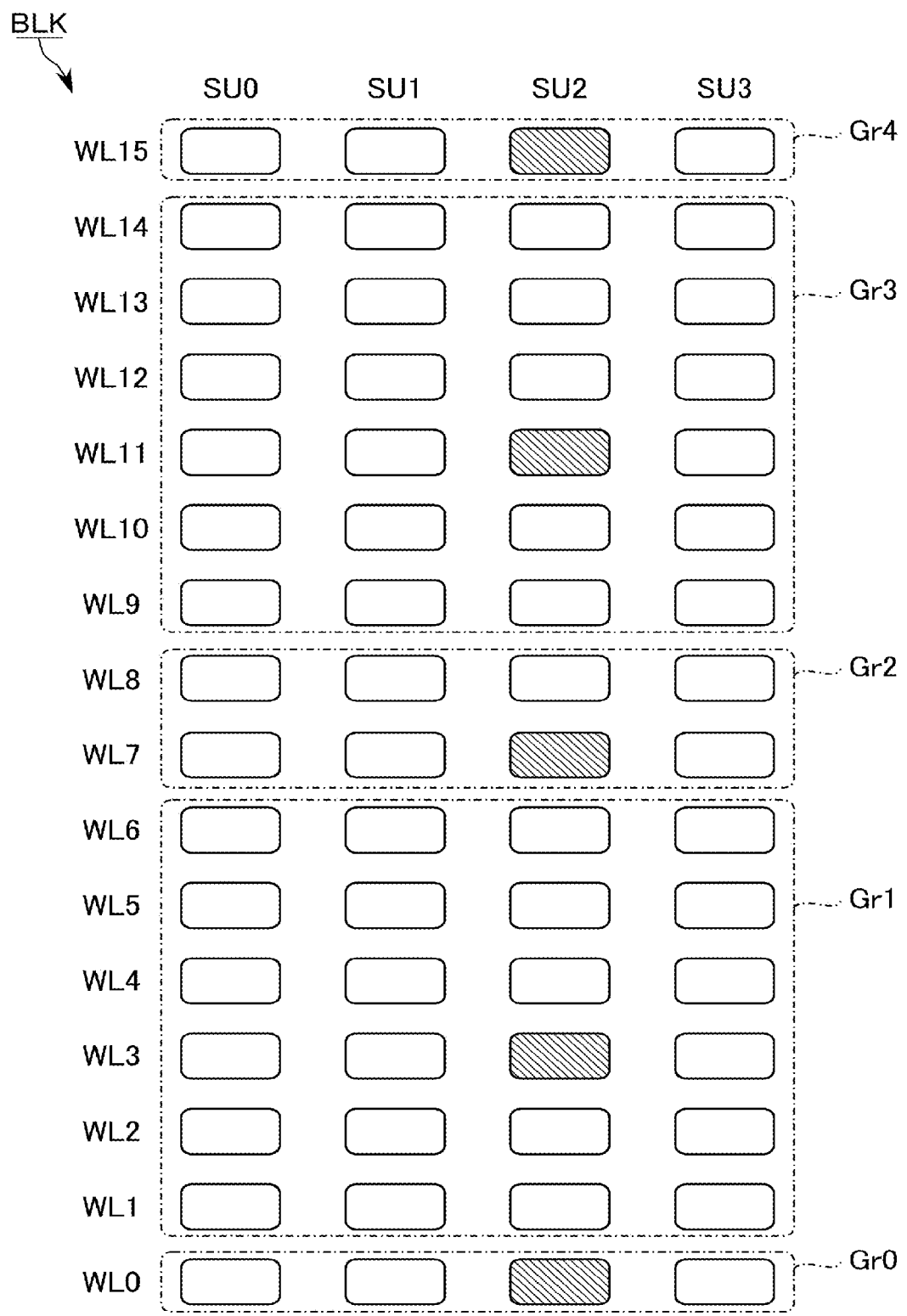
FIG. 7 is a schematic diagram illustrating a grouping of cell units in a block according to the first embodiment.

FIG. 7 is a schematic diagram illustrating the grouping the cell units in a block according to the first embodiment. In FIG. 7, 64 cell units CU of the block BLK are shown in accordance with how they correspond to the string units SU and the word lines WL.

As shown in FIG. 7, the 64 cell units CU are classified into five groups Gr (Gr0 to Gr4). Specifically, for example, the four cell units CU located in the lower end portion of the lower pillar LMP and coupled to the word line WL0 are classified into the group Gr0. The 24 cell units CU located in the central portion of the lower pillar LMP and coupled to the word lines WL1 to WL6 are classified into the group Gr1. The eight cell units CU located in the upper end portion of the lower pillar LMP and in the lower end portion of the upper pillar UMP and coupled to the word lines WL7 and WL8 are classified into the group Gr2. The 24 cell units CU located in the central portion of the upper pillar UMP and coupled to the word lines WL9 to WL14 are classified into the group Gr3. The four cell units CU located in the upper end portion of the upper pillar UMP and coupled to the word line WL15 are classified into the group Gr4.

One representative cell unit CU is assigned to each of the groups Gr0 to Gr4. The representative cell unit CU is, for example, a cell unit CU for which patrol read processing is executed, and the result of the patrol processing executed for the representative cell unit CU is stored in the representative correction amount information 21 as a representative correction amount.

In the example shown in FIG. 7, the representative cell unit CU of the group Gr0 corresponds to the pair of the string unit SU2 and the word line WL0. The representative cell unit CU of the group Gr1 corresponds to the pair of the string unit SU2 and the word line WL3. The representative cell unit CU of the group Gr2 corresponds to the pair of the string unit SU2 and the word line WL7. The representative cell unit CU of the group Gr3 corresponds to the pair of the string unit SU2 and the word line WL11. The representative cell unit CU of the group Gr4 corresponds to the pair of the string unit SU2 and the word line WL15.

The above-mentioned method of assigning the representative cell units CU is merely an example, and is not limited thereto. For example, the representative cell unit CU of a certain group Gr may be any cell unit CU within that group Gr, or may correspond to a string unit SU different from the representative cell unit CU of another group Gr. Further, in the example shown in FIG. 7, one block BLK including five groups Gr is shown, but this is not restrictive. For example, the number of groups Gr included in one block BLK may be one.

In the description set forth below, it is assumed that the grouping shown in FIG. 7 is applied to all blocks BLK, but this is not restrictive. For example, the number of groups in one block BLK and the range of each group may be different for each block BLK. Further, one group may be associated with cell units CU of a plurality of blocks BLK.

1.1.4 Representative Correction Amount Information

Next, a description will be given of the configuration of the representative correction amount information according to the first embodiment. FIG. 8 is a conceptual diagram showing an example of the configuration of the representative correction amount information according to the first embodiment.

As shown in FIG. 8, the representative correction amount information 21 includes results of patrol processing executed for the representative cell units CU of all groups Gr in the NAND flash memory 10. Specifically, the representative correction amount information 21 includes a representative correction amount $\Delta VA$ of the read voltage VA calculated for each representative cell unit CU, a representative correction amount $\Delta VB$ of the read voltage VB and a representative correction amount $\Delta VC$ of the read voltage VC. The representative correction amounts may be expressed as DAC (digital to analogue converter) values.

In the example shown in FIG. 8, a set of $\Delta VA0$, $\Delta VB0$ and $\Delta VC0$ are included as a representative correction amount of the representative cell unit CU assigned to the group Gr0 in the block BLK0 of the chip Chip0. Likewise, a set of $\Delta VA1$, $\Delta VB1$ and $\Delta VC1$, a set of $\Delta VA2$, $\Delta VB2$ and $\Delta VC2$, a set of $\Delta VA3$, $\Delta VB3$ and $\Delta VC3$, and a set of $\Delta VA4$, $\Delta VB4$ and $\Delta VC4$ are respectively included as representative correction amounts of the representative cell units CU assigned to the groups Gr1 to Gr4 in the block BLK0 of the chip Chip0.

With the above configuration, the group Gr and the representative correction amounts $\Delta VA$ to $\Delta VC$ for the read voltages VA to VC applied to the representative cell units CU are uniquely associated with each other.

1.1.5 Conversion Information

Next, a description will be given of the configuration of the conversion information according to the first embodiment.

The conversion information 22 is information used for calculating the conversion correction amounts $\Delta VA$ to $\Delta VC$ applied to the cell units CU other than the representative cell units CU in the same group Gr, based on the representative correction amounts $\Delta VA$ to $\Delta VC$ stored in the representative correction amount information 21. Specifically, for example, the conversion information 22 outputs conversion correction amounts $\Delta VA$ to $\Delta VC$ when information that specifies each of the representative cell unit CU and the cell unit CU for which correction amounts are to be calculated (for example, an address that specifies a pair of the string unit SU and the word line WL), and representative correction amounts $\Delta VA$ to $\Delta VC$ are input. The conversion information 22 can be stored, for example, in the form of a table structure or a function, but may be stored in any format having the above-mentioned functions.

By using the conversion information 22, conversion correction amounts $\Delta VA$ to $\Delta VC$ for all cell units CU of the group Gr including the representative cell unit CU can be obtained from one set of representative correction amounts $\Delta VA$ to $\Delta VC$ regarding the representative cell unit CU.

For example, the conversion correction amounts $\Delta VA$ to $\Delta VC$ of the cell unit CU corresponding to the string unit SU1 and the word line WL4 and the conversion correction amounts $\Delta VA$ to $\Delta VC$ of the cell unit CU corresponding to the string unit SU3 and the word line WL6 shown in FIG. 7 can be obtained from the representative correction amounts $\Delta VA$ to $\Delta VC$ of the group Gr1, using the same conversion information 22. The conversion correction amounts $\Delta VA$ to $\Delta VC$ of the cell unit CU corresponding to the string unit SU1 and the word line WL4 and the conversion correction amounts $\Delta VA$ to $\Delta VC$ of the cell unit CU corresponding to the string unit SU3 and the word line WL6, which are obtained by using the conversion information 22, may be different from each other.

The conversion information 22 may be one piece of information common to all groups Gr, or individual information may be assigned to each group Gr.

1.1.6 Read Voltage Correction Circuit

Next, a configuration of the read voltage correction circuit 37 provided in the memory controller 30 will be described with reference to FIG. 9.

As shown in FIG. 9, the read voltage correction circuit 37 includes a buffer memory 61, a data pattern generation circuit 62, a data pattern matching circuit 63, a plurality of bit counters 64 (64-1 to 64-6) and a correction amount calculation circuit 65.

The buffer memory 61 is, for example, a volatile memory such as an SRAM, and is a storage area for temporarily storing data used for calculating a correction amount when patrol processing is executed. The buffer memory 61 has such a capacity that enables simultaneous storage of both data read from the NAND flash memory 10 by the patrol read processing (uncorrected data) and error position information indicating the column address of an error bit included in the uncorrected data. The uncorrected data has a data size corresponding to, for example, a cell unit CU (that is, two pages consisting of an upper page and a lower page). The error position information has, for example, at least the size of an address list of data that can be detected by one-time error correction processing executed by the ECC circuit 34.

The data pattern generation circuit 62 generates a data pattern for each of the columns stored in the error position information, based on the data stored in the buffer memory 61. The data pattern is generated, for example, by concatenating the uncorrected data and corrected data of the data read from the NAND flash memory 10 by the patrol read processing.

The data pattern matching circuit 63 compares the data pattern for each column generated by the data pattern generation circuit 62 with a predetermined data pattern stored in advance, and detects a data pattern that matches the predetermined data pattern. In the example shown in FIG. 9, six types of predetermined data patterns exist. Each time a data pattern matching one of the six types of predetermined data patterns is detected, the data pattern matching circuit 63 outputs a signal indicating which of the six types is detected and sends that signal to the plurality of bit counters 64.

A plurality of bit counters 64 are provided such that the number thereof corresponds to the number of predetermined data patterns stored in the data pattern matching circuit 63. In the example shown in FIG. 9, the plurality of bit counters 64 are six bit counters 64-1 to 64-6. Each of the six bit counters 64-1 to 64-6 receives, from the data pattern matching circuit 63, a signal indicating that a data pattern matching a predetermined data pattern of the corresponding type has been detected, and increments a count value.

The correction amount calculation circuit 65 calculates a correction amount, based on the count values of the six bit counters 64-1 to 64-6. For example, the correction amount calculation circuit 65 calculates the correction amount ΔVA of the read voltage VA, based on the comparison result between the count value of the bit counter 64-1 and the count value of the bit counter 64-2. Likewise, the correction amount calculation circuit 65 calculates the correction amount ΔVB of the read voltage VB, based on the comparison result between the count value of the bit counter 64-3 and the count value of the bit counter 64-4. The correction amount calculation circuit 65 calculates the correction amount ΔVC of the read voltage VC, based on the comparison result between the count value of the bit counter 64-5 and the count value of the bit counter 64-6.

With the above configuration, the read voltage correction circuit 37 can calculate the correction amounts ΔVA to ΔVC, and the calculated correction amounts ΔVA to ΔVC can be stored in the representative correction amount information 21.

1.2 Operation

Next, a description will be given of an operation of the memory system according to the first embodiment.

1.2.1 Patrol Processing

First, a description will be given of patrol processing executed in the memory system according to the first embodiment.

Figure 10:
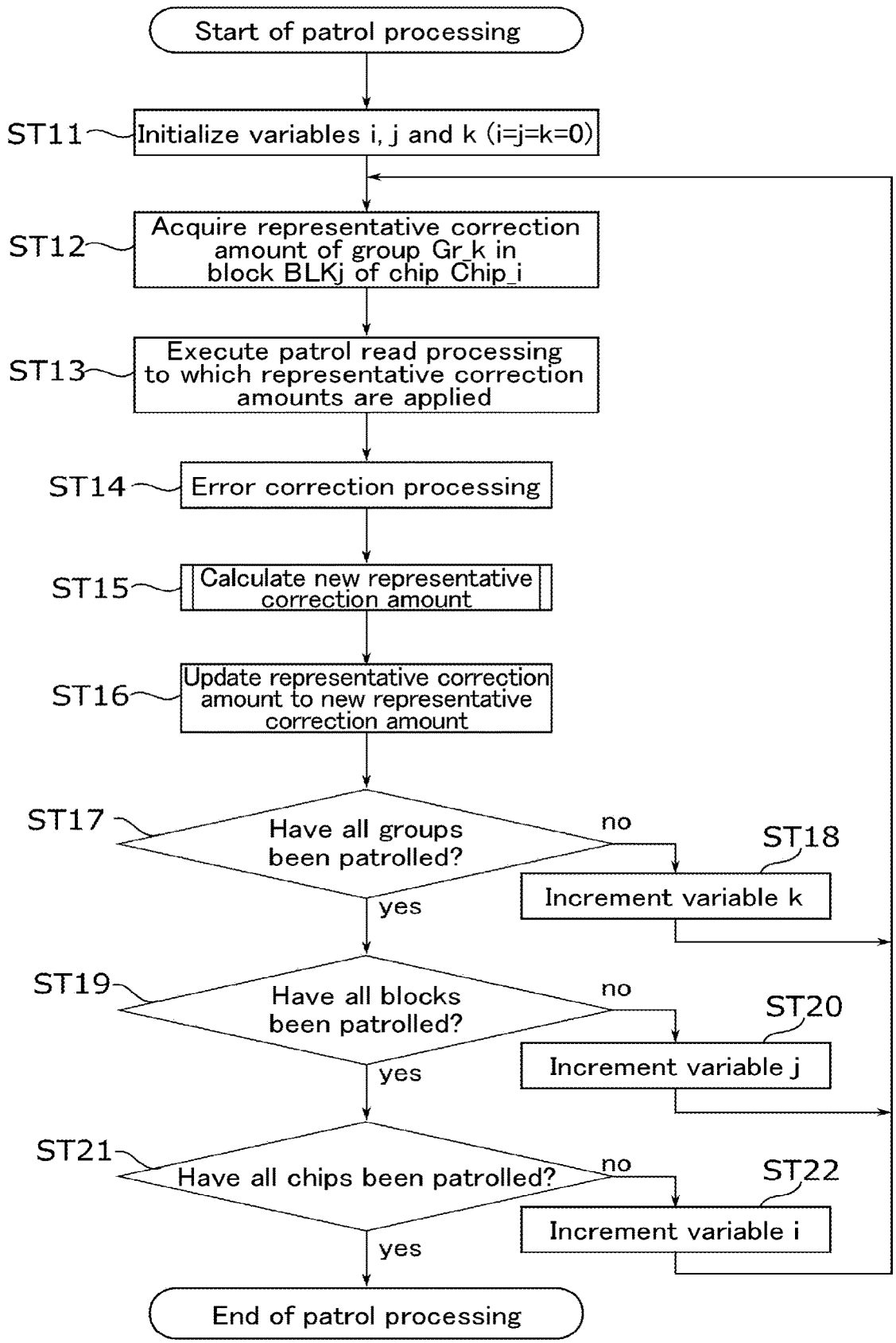
FIG. 10 is a flowchart illustrating patrol processing in the memory system according to the first embodiment.

FIG. 10 is a flowchart showing patrol processing in the memory system according to the first embodiment.

FIG. 10 shows an example of a flow in which patrol processing is executed for all groups Gr of the NAND flash memory 10.

As shown in FIG. 10, in step ST11, the memory controller 30 initializes variables i, j and k to "0" (i=j=k=0).

In step ST12, the memory controller 30 refers to the representative correction amount information 21 and acquires the representative correction amount of the group Gr_k in the block BLKj of the chip Chip_i. For example, where i=j=k=0 and in the case shown in FIG. 8, the memory controller 30 acquires DAC values indicating ΔVA0, ΔVB0 and ΔVC0 as representative correction amounts.

In step ST13, the memory controller 30 executes patrol read processing to which the representative correction amounts acquired in step ST12 are applied, for the representative cell unit CU of the group Gr_k in the block BLKj of the chip Chip_i. Specifically, the memory controller 30 issues a command set to execute the patrol read processing and sends it to the NAND flash memory 10. Upon receiving the command set, the NAND flash memory 10 reads data from the representative cell unit CU, using the read voltage to which the representative correction amount is applied, and outputs that data to the memory controller 30.

In the description set forth below, reference will be made to a case where in the patrol read processing, the NAND flash memory 10 reads data from all pages stored in the representative cell unit CU and outputs the data to the memory controller 30. However, this is not restrictive.

For example, the NAND flash memory 10 may read data from one specific page or more pages stored in the representative cell unit CU and output the data to the memory controller 30. At this time, the NAND flash memory 10 may further read data from the representative cell unit CU, using one read voltage, in addition to the one or more page data, and may output the data to the memory controller 30.

In any case, the memory controller 30 acquires the uncorrected data necessary for calculating a new representative correction amount from the NAND flash memory 10. Then, the memory controller 30 stores the uncorrected data in the buffer memory 61.

In step ST14, the ECC circuit 34 of the memory controller 30 executes error detection processing on the uncorrected data acquired in step ST13. The ECC circuit 34 generates error position information including an error position specified by the error detection processing, and stores the error position information in the buffer memory 61.

In step ST15, the read voltage correction circuit 37 executes correction amount calculation processing to calculate a new representative correction amount for the representative cell unit CU. Details of the correction amount calculation processing will be described later.

In step ST16, the memory controller 30 updates the representative correction amount corresponding to the representative cell unit CU of the group Gr_k of the block BLKj of the chip Chip_i in the representative correction amount information 21 to the new representative correction amount calculated in step ST15. As a result, the correction amount of the read voltage to be applied to the representative cell unit CU is updated to an appropriate value.

In step ST17, the memory controller 30 determines whether or not all groups Gr in the block BLKj of the chip Chip_i have been patrolled. Where all groups Gr have been patrolled (yes in step ST17), the process proceeds to step ST19, and where there are groups Gr that have not been patrolled (no in step ST17), the process proceeds to step ST18.

In step ST18, the memory controller 30 increments the variable k. Subsequently, the process returns to step ST12. In this manner, steps ST12 to ST18 are repeated until the patrol processing is completed for all groups Gr in the block BLKj of the chip Chip_i.

In step ST19, the memory controller 30 determines whether or not all blocks BLK of the chip Chip_i have been patrolled. Where all blocks BLKs have been patrolled (yes in step ST19), the process proceeds to step ST21, and where there are blocks BLK that have not been patrolled (no in step ST19), the process proceeds to step ST20.

In step ST20, the memory controller 30 increments the variable j. Subsequently, the process returns to step ST12. In this manner, steps ST12 to ST20 are repeated until the patrol processing is completed for all blocks BLK in the chip Chip_i.

In step ST21, it is determined whether or not all chips in the NAND flash memory 10 have been patrolled. Where all chips have been patrolled (yes in step ST21), the patrol processing is ended, and where there are chips that have not been patrolled (no in step ST21), the process proceeds to step ST22.

In step ST22, the memory controller 30 increments the variable i. Subsequently, the process returns to step ST12. In this manner, steps ST12 to ST22 are repeated until the patrol processing is completed for all chips in the NAND flash memory 10.

By the operation described above, the patrol processing for all groups Gr in the NAND flash memory 10 is completed.

The flow of patrol processing described above is merely an example, and the flow is not limited to this.

For example, in the above-mentioned patrol processing, the number of blocks BLK subjected to patrol processing may differ depending on the chip. In addition, the number of groups Gr subjected to patrol processing may differ depending on the block BLK.

In the example shown in FIG. 10, reference was made to the case where the patrol processing is executed at the same timing for all groups Gr in the NAND flash memory 10, but this is not restrictive. For example, the memory controller 30 can set the execution frequency of the patrol processing at a certain timing for each group Gr, for each block ELK, or for each chip.

In the example shown in FIG. 10, reference was made to the case where the patrol processing is executed for all groups Gr in the NAND flash memory 10, but this is not restrictive. For example, the memory controller 30 may exclude part of the storage area of the NAND flash memory 10 from the patrol processing targets. Specifically, for example, an unused block BLK in which no data is written, an invalid block to which valid data is not written and which is not referred to, and the like, can be excluded from the patrol processing targets.

Further, in the example shown in FIG. 10, reference was made to the case where the patrol processing is executed sequentially for each chip, but this is not restrictive. For example, the patrol processing may be executed in parallel for a plurality of chips.

1.2.2 Correction Amount Calculation Processing

Next, a description will be given of the correction amount calculation processing.

Figure 11:
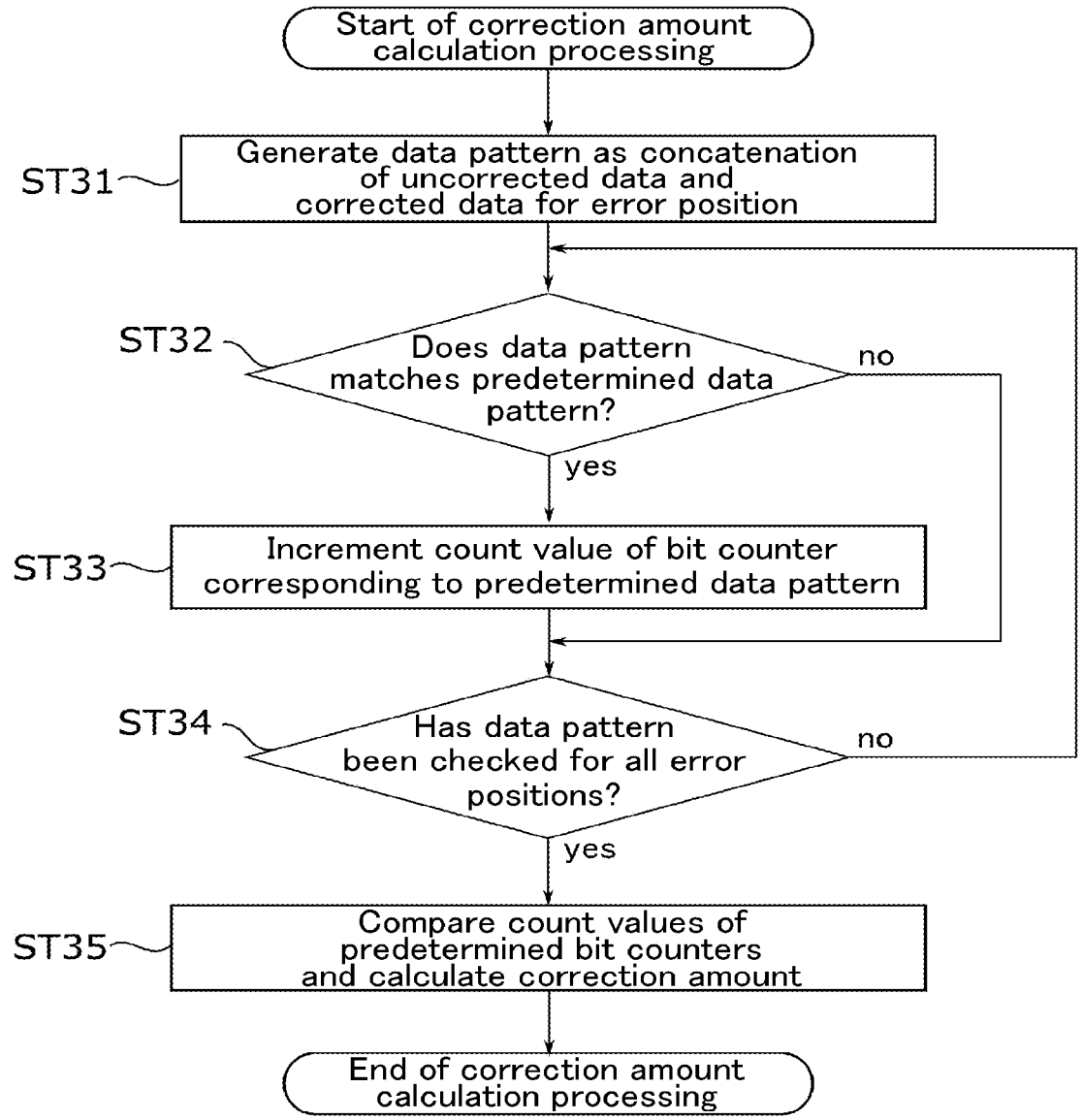
FIG. 11 is a flowchart illustrating correction amount calculation processing in the memory system according to the first embodiment.

FIG. 11 is a flowchart showing correction amount calculation processing in the memory system according to the first embodiment, and the flowchart corresponds to step ST15 shown in FIG. 10. In FIG. 11, it is assumed that the buffer memory 61 stores uncorrected data and error position information.

As shown in FIG. 11, in step ST31, the data pattern generation circuit 62 generates a data pattern, which is a concatenation of uncorrected data and corrected data, for a selected error position, based on the uncorrected data and error position information stored in the buffer memory 61.

In step ST32, the data pattern matching circuit 63 determines, for each error position, whether or not the data pattern generated in step ST31 matches a predetermined data pattern. Where the data pattern matches the predetermined data pattern (yes in step ST32), the data pattern matching circuit 63 sends a signal indicating that the data pattern matches the predetermined data pattern to the bit counter 64 corresponding to the predetermined data pattern, and the process proceeds to step ST33. On the other hand, where the data pattern does not match the predetermined data pattern (no in step ST32), the process skips step ST33 and proceeds to step ST34.

In step ST33, the counter which is one of the plurality of bit counters 64-1 to 64-6 and which receives the signal from the data pattern matching circuit 63 in step ST32 increments the count value.

In step ST34, the data pattern matching circuit 63 determines whether or not the data pattern has been checked for all error positions. Where it is determined that the data pattern has been checked for all error positions (yes in step ST34), the process proceeds to step ST35. Where there is a data pattern that has not yet been determined to match the predetermined data pattern (no in step ST34), the process returns to step ST32. In this manner, steps ST32 to ST34 are repeated until the check for the data patterns at all error positions is completed.

In step ST35, the correction amount calculation circuit 65 compares the count values of the predetermined bit counters 64 included among the plurality of bit counters 64-1 to 64-6, and calculates a correction amount based on the comparison result.

In the manner described above, the correction amount calculation processing is completed.

Figure 12:
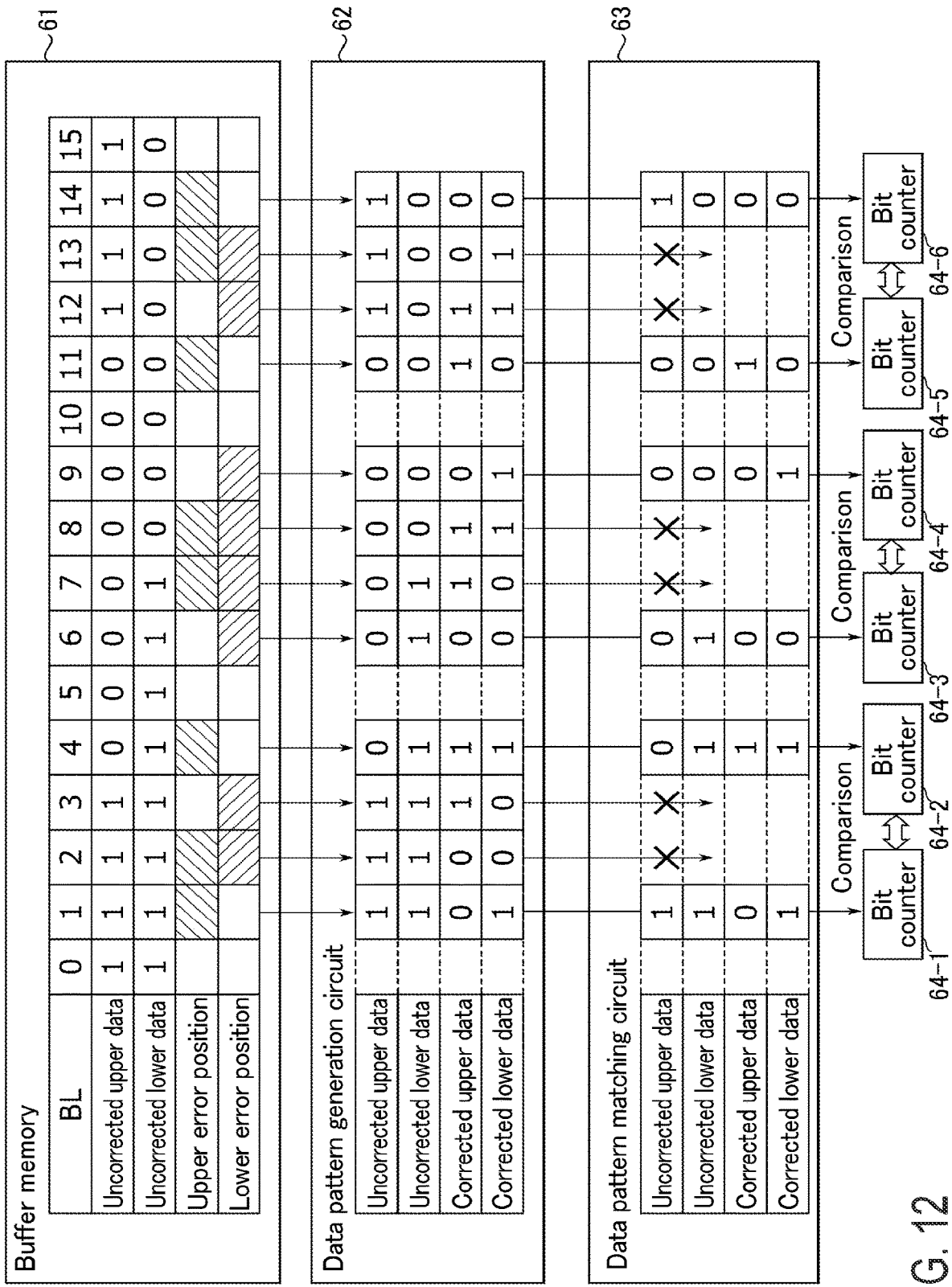
FIG. 12 is a schematic diagram illustrating correction amount calculation processing in the memory system according to the first embodiment.
Figure 13:
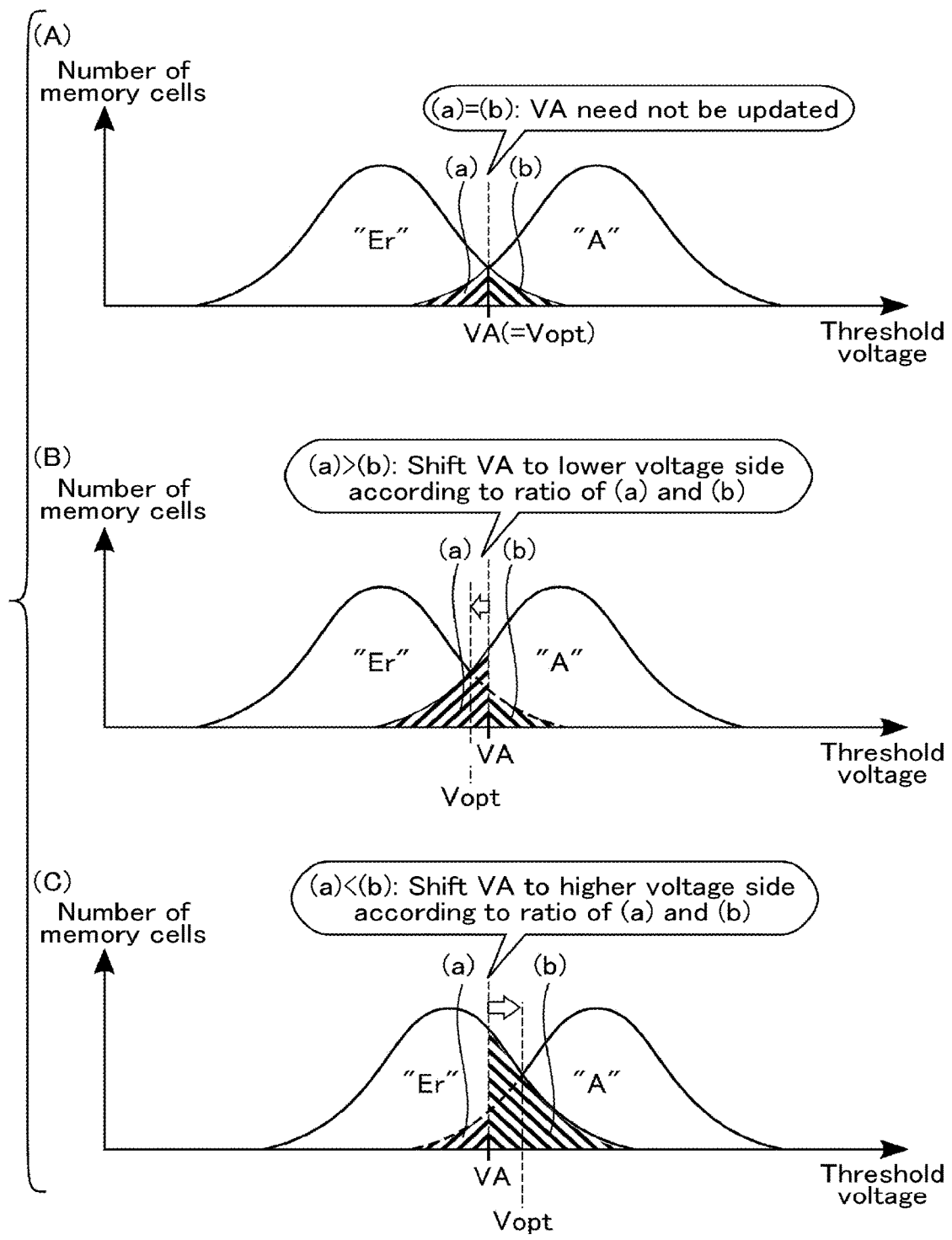
FIG. 13 is a schematic diagram illustrating correction amount calculation processing in the memory system according to the first embodiment.

FIG. 12 and FIG. 13 are schematic views showing the correction amount calculation processing in the memory system according to the first embodiment. FIG. 12 shows a specific example of steps ST31 to ST34 shown in FIG. 11, and FIG. 13 shows a specific example of step ST35 shown in FIG. 11.

First, the specific example of steps ST31 to ST34 shown in FIG. 11 will be described with reference to FIG. 12.

The example in FIG. 12 shows data (uncorrected data) which is included in the uncorrected data stored in the buffer memory 61 and which is read from the memory cell transistors MT coupled to the bit lines BL0 to BL15. It is assumed that the bit lines BL0 to BL15 correspond to, for example, column addresses CADD0 to CADD15, respectively.

As shown in FIG. 12, the ECC circuit 34 detects column addresses CADD1, CADD2, CADD4, CADD7, CADD8, CADD11, CADD13 and CADD14 as error positions from the uncorrected upper-page data (upper data before correction). Further, the ECC circuit 34 detects column addresses CADD2, CADD3, CADD6, CADD7, CADD8, CADD9, CADD12 and CADD13 as error positions from the uncorrected lower-page data (lower data before correction). As a result, the buffer memory 61 stores the error position information indicating the above-mentioned column addresses CADD for each of the upper page and the lower page.

The data pattern generation circuit 62 generates a data pattern indicated by, for example, "uncorrected upper bit/uncorrected lower bit/corrected upper bit/corrected lower bit" for the column addresses CADD corresponding to the error positions, based on the information stored in the buffer memory 61. Specifically, the data pattern generation circuit 62 generates data pattern "1101" for the column address CADD1 at which an error is detected in the upper bit of the uncorrected data "11." Likewise, the data pattern generation circuit 62 generates data patterns "1100", "1110", "0111", "0100", "0110", "0011", "0001", "0010", "1011", "1001" and "1000" for the column addresses CADD2 to CADD4, CADD6 to CADD9 and CADD11 to CADD14, respectively.

With respect to various data patterns generated by the data pattern generation circuit 62, the number of data patterns matching a predetermined data pattern stored in advance in the data pattern matching circuit 63 is counted by a plurality of bit counters 64-1 to 64-6. Specifically, in the data pattern matching circuit 63, for example, six types of data patterns "1101", "0111", "0100", "0001", "0010" and "1000" are stored in advance as predetermined data patterns. The number of data patterns matching each of the six types of predetermined data patterns is counted by the plurality of bit counters 64-1 to 64-6.

In the example shown in FIG. 12, the bit counter 64-1 counts the number of data patterns "1101", the bit counter 64-2 counts the number of data patterns "0111", the bit counter 64-3 counts the data patterns "0100", the bit counter 64-4 counts the number of data patterns "0001", the bit counter 64-5 counts the number of data patterns "0010", and the bit counter 64-6 counts the number of data patterns "1000."

Note that FIG. 12 is just an example, and the correspondence between data pattern and the error position is not limited to this example, and there are various cases.

Next, the specific example of steps ST35 shown in FIG. 11 will be described with reference to FIG. 13.

In the example shown in FIG. 13, the count values for the data patterns "1101" and "0111", which are among the six types of predetermined data patterns shown in FIG. 12, are compared with each other.

As described with reference to FIG. 4, the data "11" indicates the "Er" state and the data "01" indicates the "A" state. Therefore, the count value of the bit counter 64-1 corresponding to the predetermined data pattern "1101" corresponds to the number of memory cells from which the data written in the "A" state is erroneously read as being in the "Er" state (the area of the region (a) shown in FIG. 13(A) to FIG. 13(C)). Further, the count value of the bit counter 64-2 corresponding to the predetermined data pattern "0111" corresponds to the number of memory cells from which the data written in the "Er" state is erroneously read as being in the "A" state (the area of the region (b) shown in FIG. 13(A) to FIG. 13 (C)).

FIG. 13(A) shows a case where the read voltage VA is equal to the threshold voltage Vopt at the intersection of the two threshold voltage distributions corresponding to the "Er" state and "A" state. In the case shown in FIG. 13(A), the count value of the bit counter 64-1 and the count value of the bit counter 64-2 are equal to each other. In this case, the error bit number E12 (the sum of the count values of the two bit counters 64-1 and 64-2) is expected to be the minimum, so that the correction amount calculation circuit 65 determines that the read voltage VA need not be updated. That is, the correction amount calculation circuit 65 calculates the correction amount ΔVA as "0" (ΔVA=0).

FIG. 13(B) shows a case where the read voltage VA is on the higher voltage side of the threshold voltage Vopt at the intersection of the two threshold voltage distributions corresponding to the "Er" state and "A" state. In the case shown in FIG. 13(B), the count value of the bit counter 64-1 is larger than the count value of the bit counter 64-2. In this case, the error bit number E12 is larger than the error bit number E12 of the case shown in FIG. 13 (A), which is not preferable. Therefore, the correction amount calculation circuit 65 shifts the read voltage VA to the lower voltage side such that it is closer to the voltage Vopt. That is, the correction amount calculation circuit 65 calculates a negative correction amount ΔVA (ΔVA<0).

FIG. 13(C) shows a case where the read voltage VA is on the lower voltage side of the threshold voltage Vopt at the intersection of the two threshold voltage distributions corresponding to the "Er" state and "A" state. In the case shown in FIG. 13(C), the count value of the bit counter 64-1 is larger than the count value of the bit counter 64-2. In this case, the error bit number E12 is larger than the error bit number E12 of the case shown in FIG. 13(A), which is not preferable. Therefore, the correction amount calculation circuit 65 shifts the read voltage VA to the higher voltage side such that it is closer to the voltage Vopt. That is, the correction amount calculation circuit 65 calculates a positive correction amount ΔVA (ΔVA>0).

The absolute value of the difference between the count values of the bit counters 64-1 and 64-2 is expected to increase as the read voltage VA deviates more from the threshold voltage Vopt. Therefore, the correction amount calculation circuit 65 determines the correction amount ΔVA of the read voltage VA according to the ratio of the count values of the bit counters 64-1 and 64-2. Owing to this, an appropriate correction amount can be determined according to the degree of overlap of the threshold voltage distributions, and the correction amount ΔVA can be calculated such that the read voltage is close to an ideal voltage Vopt.

Although not shown, the correction amounts ΔVB and ΔVC are calculated for the read voltages VB and VC in a similar manner to that for the read voltage VA.

That is, the count value of the bit counter 64-3 corresponding to the predetermined data pattern "0100" corresponds to the number of memory cells from which the data written in the "B" state is erroneously read as being in the "A" state. The count value of the bit counter 64-4 corresponding to the predetermined data pattern "0001" corresponds to the number of memory cells from which the data written in the "A" state is erroneously read as being in the "B" state. Therefore, the correction amount calculation circuit 65 determines the correction amount ΔVB of the read voltage VB according to the ratio of the count values of the bit counters 64-3 and 64-4.

Likewise, the count value of the bit counter 64-5 corresponding to the predetermined data pattern "0010" corresponds to the number of memory cells from which the data written in the "C" state is erroneously read as being in the "B" state. The count value of the bit counter 64-6 corresponding to the predetermined data pattern "1000" corresponds to the number of memory cells from which the data written in the "B" state is erroneously read as being in the "C" state. Therefore, the correction amount calculation circuit 65 determines the correction amount ΔVC of the read voltage VC according to the ratio of the count values of the bit counters 64-5 and 64-6.

By the operation described above, the representative correction amounts ΔVA to ΔVC stored in the representative correction amount information 21 are updated based on the data read from the representative cell unit CU.

1.2.3 Host Read Processing

Next, a description will be give of host read processing in the memory system according to the first embodiment.

Figure 14:
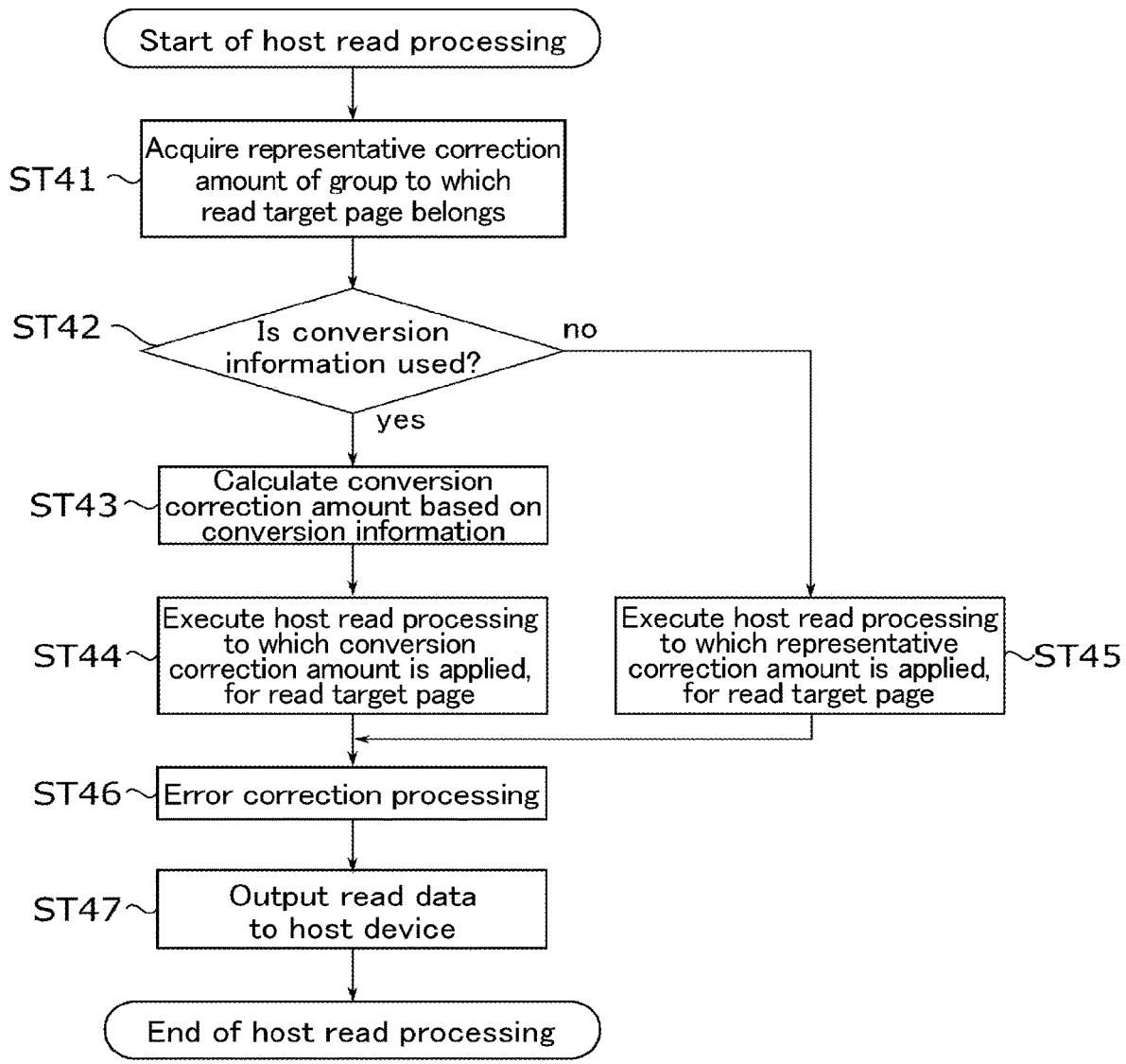
FIG. 14 is a flowchart illustrating host read processing in the memory system according to the first embodiment.

FIG. 14 is a flowchart showing the host read processing in the memory system according to the first embodiment.

As shown in FIG. 14, in step ST41, upon receiving a read request from the host device 2, the memory controller 30 refers to the representative correction amount information 21 in response to the read request, and acquires a representative correction amount of the group Gr to which a read target page belongs.

In step ST42, the memory controller 30 determines whether or not to use the conversion information 22 with respect to the read voltage used for the host read processing. Where the conversion information 22 is used (yes in step ST42), the process proceeds to step ST43.

In step ST43, the memory controller 30 calculates a conversion correction amount, based on the conversion information 22. Specifically, the memory controller 30 inputs information specifying each of the representative cell unit CU and the read target page and a representative correction amount to the conversion information 22, and obtains a conversion correction amount as an output.

In step ST44, the memory controller 30 executes host read processing to which the conversion correction amount acquired in step ST43 is applied, for the read target page. Specifically, the memory controller 30 issues a command set to execute the above-mentioned host read processing and sends it to the NAND flash memory 10. Upon receiving the command set, the NAND flash memory 10 reads data from the read target page, using the read voltage to which the conversion correction amount is applied, and outputs the data to the memory controller 30. Subsequently, the process proceeds to step ST46.

On the other hand, where the conversion information 22 is not used for the read voltage used for the host read processing (no in step ST42), the process proceeds to step ST45.

In step ST45, the memory controller 30 executes host read processing to which the representative correction amount acquired in step ST41 is applied, for the read target page. Specifically, the memory controller 30 issues a command set to execute the above-mentioned host read processing and sends it to the NAND flash memory 10. Upon receiving the command set, the NAND flash memory 10 reads data from the read target page, using the read voltage to which the representative correction amount is applied, and outputs the data to the memory controller 30. Subsequently, the process proceeds to step ST46.

In step ST46, the ECC circuit 34 of the memory controller 30 executes error correction processing on the data read in step ST44 or ST46. Thereby, an error contained in the read data is corrected.

In step ST47, the memory controller 30 outputs the error-corrected read data to the host device 2.

In this manner, the host read processing is completed.

1.3 Advantages of Present Embodiment

According to the first embodiment, the representative correction amount information 21 stores a representative correction amount for each group Gr. At the time of patrol processing, the memory controller 30 executes the patrol read processing, using the representative correction amount, and updates the representative correction amount to a new representative correction amount. During the host read processing, the memory controller 30 determines a correction amount used for the host read processing, based on the representative correction amount associated with the group Gr to which the read target page belongs. Thus, an appropriate read voltage can be set for the cell units CU other than the representative cell unit CU, with no need to store correction amounts individually for all cell units CU in the representative correction amount information 21. Therefore, it is possible to suppress an increase in the memory capacity of the DRAM 20 while suppressing an increase in the number of error bits included in the read data. In addition, since the patrol processing for determining the correction amounts for all cell units CU is not necessary, the number of times patrol processing is executed can be reduced. Therefore, it is possible to suppress an increase in the load of the memory system 1 due to the patrol processing.

Specifically, where the degree of overlap of adjacent threshold voltage distributions can be regarded as substantially the same in groups of cell units CU, the memory controller 30 classifies these groups of cell unit CUs into one group Gr. As a result, the memory controller 30 can apply the representative correction amount as it is, at the time of host read processing for the cell units CU of the group Gr. Therefore, the correction amount to be stored for the group Gr can be reduced to the correction amount required for one cell unit CU.

Further, where the degree of overlap of adjacent threshold voltage distributions in one cell unit CU can be used for predicting the degree of overlap of adjacent threshold voltage distributions in another cell unit CU, the memory controller 30 classifies these groups of cell units CU into one group, and a prediction formula is stored as conversion information 22. Thus, by applying the conversion information 22 to the representative correction amount, the memory controller 30 can acquire a correction amount of any cell unit CU in the group Gr as the conversion correction amount. Therefore, the correction amount to be stored for the group Gr can be reduced to the correction amount required for one cell unit CU.

As described above, the manner in which the threshold voltage fluctuates significantly differs at the ends of the upper pillar UMP and lower pillar LMP, as compared with the manner at the other portions. In this case, the memory controller 30 limits the cell units CU included in the group Gr to the cell units CU located at the ends. In this way, the range in which the application or conversion of the representative correction amount is allowed can be set according to the physical positional relationship of the cell units CU with respect to the memory pillar MP (for example, the word line WL or the string unit SU), so that the accuracy of the correction amount applied to the host read processing can be adjusted.

Further, the data pattern generation circuit 62 of the read voltage correction circuit 37 generates a data pattern by concatenating uncorrected data and corrected data only for the column address where an error has occurred, based on the uncorrected data and the column address of an error bit. As a result, data patterns for all column addresses do not have to be stored in the buffer memory 61. Therefore, an increase in the capacity of the buffer memory 61 can be suppressed.

The correction amount calculation circuit 65 compares the count values of generated data patterns that match predetermined data patterns, and calculates a correction amount based on the comparison result. As a result, the correction amount can be increased or decreased according to the degree of overlap of the threshold voltage distributions. Therefore, the read voltage to which the correction amount is applied can be made close to the ideal read voltage Vopt.

2. Second Embodiment

Next, a description will be given of a memory system according to the second embodiment. The second embodiment differs from the first embodiment in that the DRAM 20 does not directly store a representative correction amount. In the description set forth below, the configuration and operation similar to those of the first embodiment will not be mentioned, and the configuration and operation different from those of the first embodiment will be mainly mentioned.

2.1 Configuration of Memory System

Figure 15:
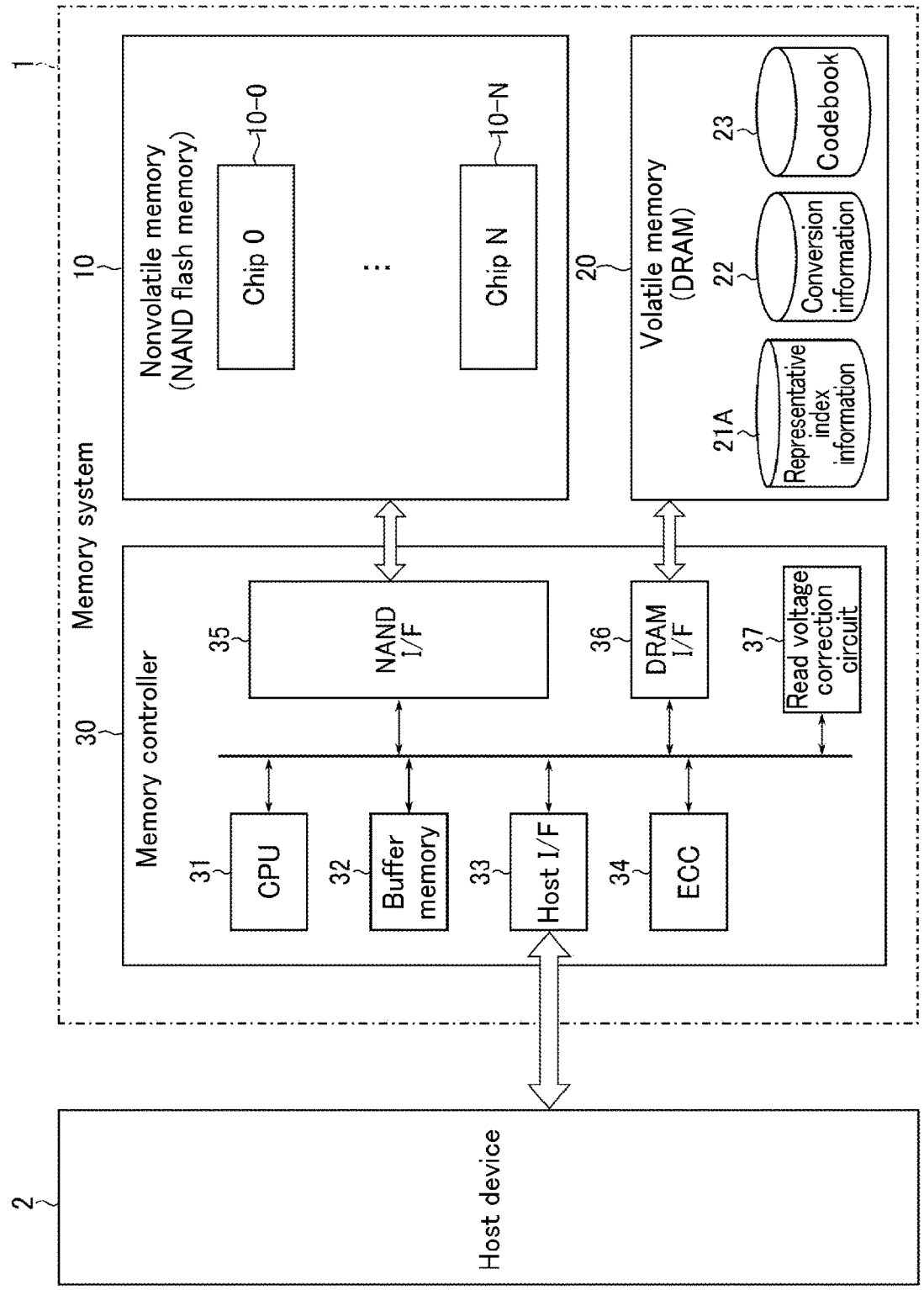
FIG. 15 is a block diagram illustrating a configuration of a memory system according to a second embodiment.

FIG. 15 is a block diagram showing the configuration of the memory system according to the second embodiment, and corresponds to FIG. 1 of the first embodiment.

As shown in FIG. 15, the DRAM 20 stores representative index information 21A, conversion information 22 and a codebook 23, as information for applying results of patrol processing to the host read processing.

First, a configuration of the representative index information 21A will be described.

The representative index information 21A is information that stores information (index) obtained by compressing the correction amount of read voltages calculated based on the result of patrol read processing. In the representative index information 21A, an index obtained by compressing correction amount for predetermined memory cells, which one of the memory cells of the NAND flash memory 10, is stored as a representative index.

FIG. 16 is a conceptual diagram showing an example of the representative index information of the memory system according to the second embodiment. As shown in FIG. 16, the representative index information 21A includes a representative index ID obtained by compressing a set of a representative correction amount ΔVA of the read voltage VA calculated for each representative cell unit CU, a representative correction amount ΔVB of the read voltage VB and a representative correction amounts ΔVC of the read voltage VC.

In the example shown in FIG. 16, ID0 is stored as a representative index of the representative cell unit CU assigned to the group Gr0 in the block BLK0 of the chip Chip0. Similarly, ID1 to ID4 are stored as representative indexes of the representative cell units CU assigned to the groups Gr1 to Gr4 in the block BLK0 of the chip Chip0, respectively.

With the above configuration, the group Gr and the representative index ID obtained by compressing the read voltages VA to VC applied to the representative cell unit CU are uniquely associated with each other.

Next, a description will be given of a configuration of the codebook 23.

The codebook 23 is information including a correspondence relationship between a correction amount and an index. The correspondence relationship is used when a correction amount is compressed to the corresponding index and when an index is decompressed to the corresponding correction amount.

FIG. 17 is a conceptual diagram showing an example of the codebook of the memory system according to the second embodiment. As shown in FIG. 17, the index ID0 is associated with a set of correction amounts ΔVA0, ΔVB0 and ΔVC0. Similarly, the indexes ID1 to ID4 are respectively associated with a set of correction amounts ΔVA1 to ΔVC1, a set of correction amounts ΔVA2 to ΔVC2, a set of correction amounts ΔVA3 to ΔVC3 and a set of correction amounts ΔVA4 to ΔVC4.

With the above configuration, a correspondence relationship similar to that of the representative correction amount information 21 of the first embodiment can be obtained by combining the codebook 23 and the representative index information 21A with each other.

The codebook 23 may be configured such that a correction amount can be restored by compression and decompression, or may be configured such that the correction amount cannot be restored. Where the codebook 23 is configured such that the correction amount cannot be restored, the correction amount may differ before and after a set of compression and decompression is executed using the codebook 23 (an error caused by lossy compression may occur).

2.2 Patrol Processing

Next, a description will be given of patrol processing executed in the memory system according to the second embodiment.

Figure 18:
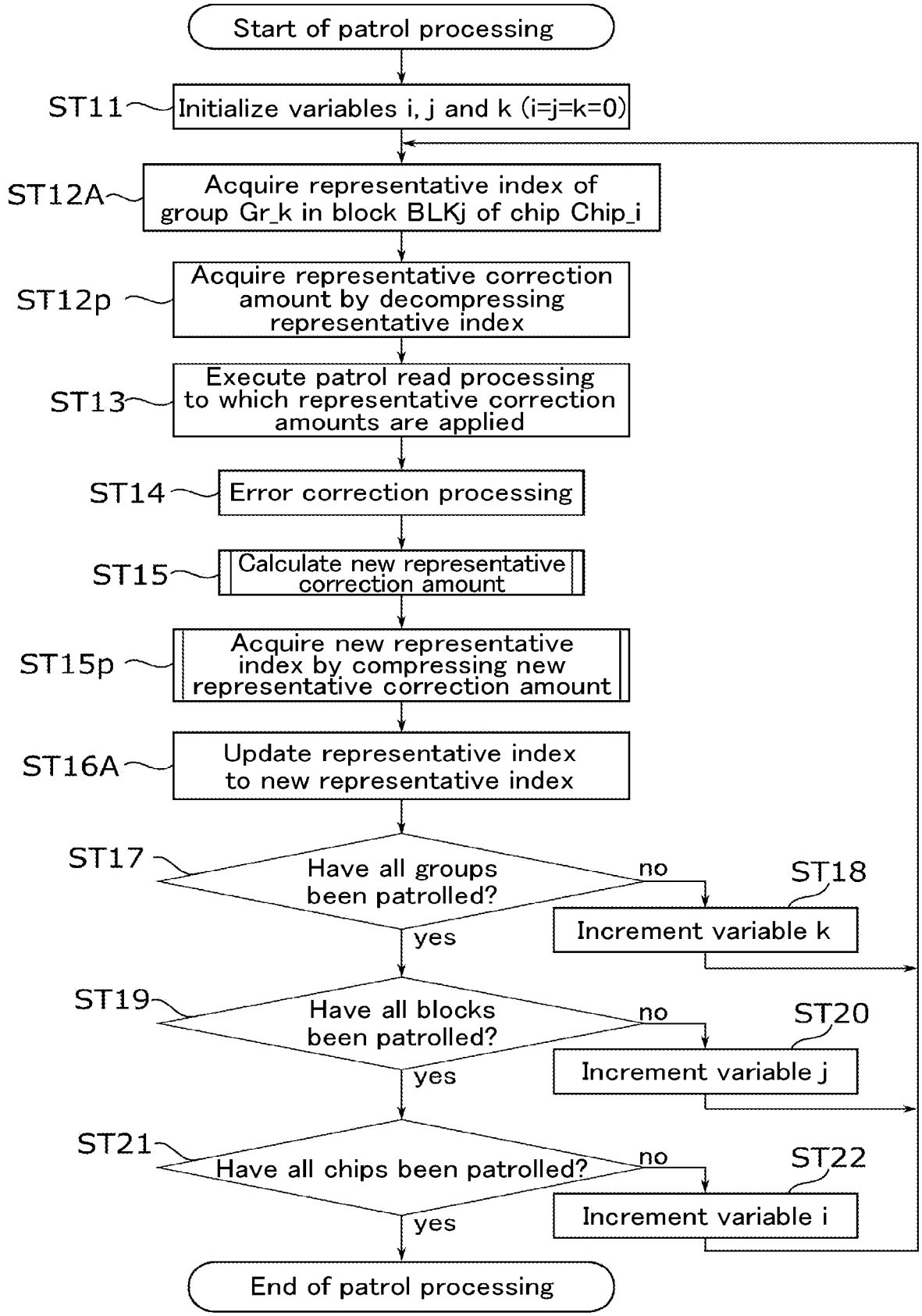
FIG. 18 is a flowchart illustrating patrol processing in the memory system according to the second embodiment.

FIG. 18 is a flowchart showing patrol processing in the memory system according to the second embodiment, and corresponds to FIG. 10 of the first embodiment. In FIG. 18, steps ST12A and ST16A are executed in place of steps ST12 and ST16 shown in FIG. 10, step ST12p is executed between steps ST12A and ST13, and step ST15p is executed between steps ST15 and ST16A.

As shown in FIG. 18, in step ST11, the memory controller 30 initializes variables i, j and k to "0" (i=j=k=0).

In step ST12A, the memory controller 30 refers to the representative index information 21A and acquires a representative index of the group Gr_k in the block BLKj of the chip Chip_i. For example, where i=j=k=0, the memory controller 30 acquires the representative index ID0 according to FIG. 16.

In step ST12p, the memory controller 30 acquires a representative correction amount by decompressing the representative index acquired in step ST12A based on the codebook 23.

In steps ST13 to ST15, the memory controller 30 executes patrol read processing based on the representative correction amount, and executes error detection processing for obtained uncorrected data. Then, the memory controller 30 executes correction amount calculation processing to calculate a new representative correction amount. Since steps ST13 to ST15 are similar to steps ST13 to ST15 shown in FIG. 10, a specific description thereof will be omitted.

In step ST15p, the memory controller 30 acquires a new representative index by compressing the new representative correction amount calculated in step ST15 based on the codebook 23. Details of the acquisition processing of the new representative index will be described later.

In step ST16A, the memory controller 30 updates the representative index corresponding to the representative cell unit CU of the group Gr_k in the block BLKj of the chip Chip_i in the representative index information 21A to the new representative index acquired in step ST15p.

In steps ST17 to ST22, the memory controller 30 completes the patrol processing for all groups Gr of the NAND flash memory 10. Since steps ST17 to ST22 are similar to steps ST17 to ST22 shown in FIG. 10, a description thereof will be omitted.

By the operation described above, the patrol processing is completed.

2.3. New Representative Index Acquisition Processing

Next, a description will be given of some examples of new representative index acquisition processing executed in the memory system according to the second embodiment.

2.3.1 First Example

First, a description will be given of a first example of the new representative index acquisition processing. In the first example, the sum of the absolute values of the differences between a new representative correction amount and a correction amount in the codebook 23 for each read level is used as an evaluation value. The memory controller 30 extracts an index that minimizes the evaluation value from the codebook 23 and acquires it as a new index.

Figure 19:
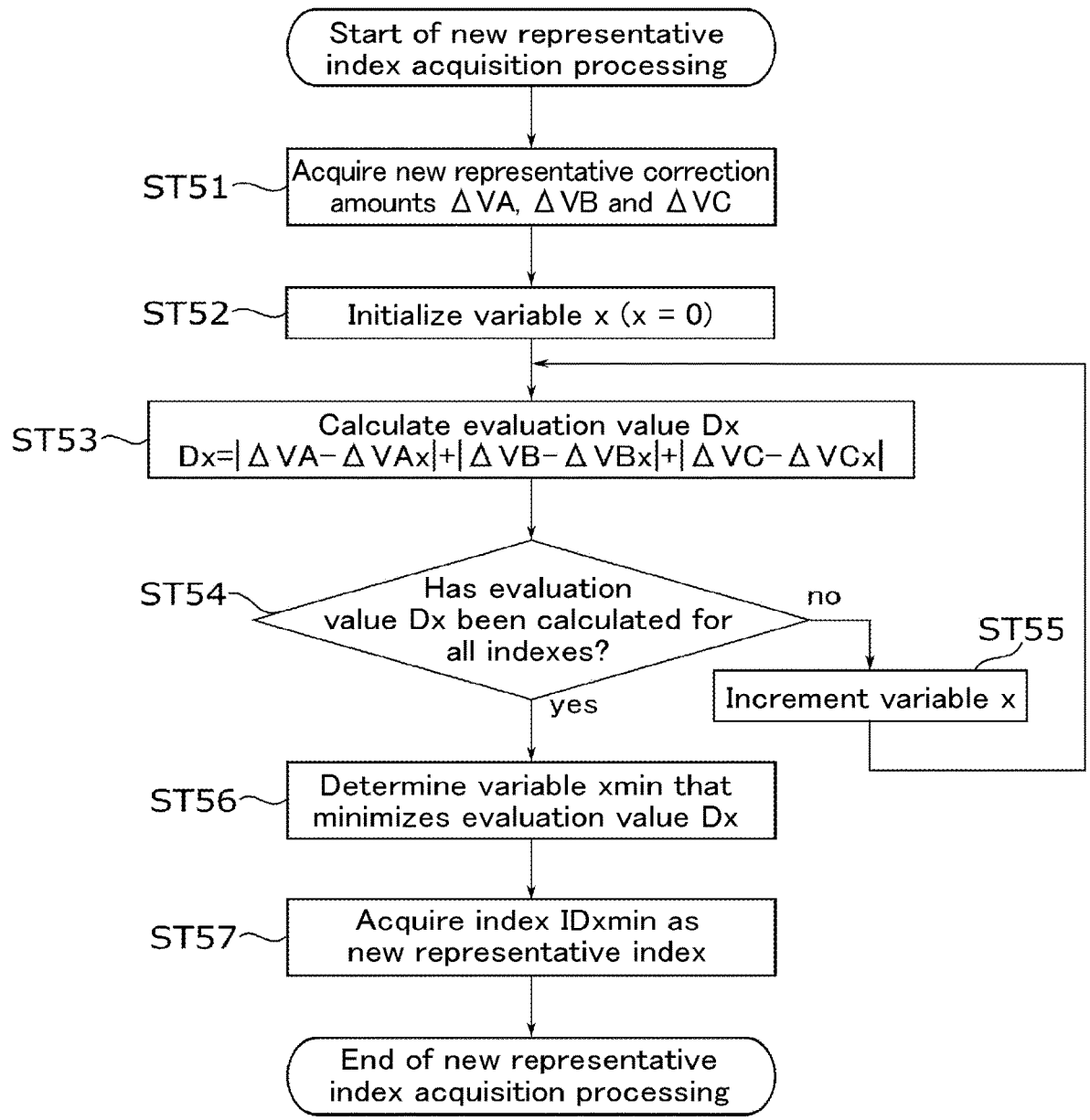
FIG. 19 is a flowchart illustrating a first example of new representative index acquisition processing in the memory system according to the second embodiment.

FIG. 19 is a flowchart showing new representative index acquisition processing in the memory system according to the second embodiment, and corresponds to step ST15p shown in FIG. 18.

As shown in FIG. 19, in step ST51, the memory controller 30 acquires new representative correction amounts ΔVA, ΔVB and ΔVC calculated in step ST15 shown in FIG. 18.

In step ST52, the memory controller 30 initializes the variable x to "0" (x=0).

In step ST53, the memory controller 30 calculates an evaluation value Dx expressed in the following equation, based on the new representative correction amounts ΔVA to ΔVC and the correction amounts ΔVAx to ΔVCx corresponding to the index IDx of the codebook 23.

$$Dx=|\Delta VA-\Delta VAx|+|\Delta VB-\Delta VBx|+|\Delta VC-\Delta VCx|$$

In step ST54, the memory controller 30 determines whether or not the evaluation value Dx has been calculated for all indexes.

Where there is an index for which the evaluation value Dx has not been calculated (no in step ST54), the process proceeds to step ST55. In step ST55, the memory controller 30 increments the variable x. Subsequently, the process returns to step ST53. Steps ST53 to ST55 are repeated until the evaluation value Dx is calculated for all indexes.

Where the evaluation value Dx is calculated for all indexes (yes in step ST54), the process proceeds to step ST56. In step ST56, the memory controller 30 determines a variable xmin that minimizes the evaluation value Dx.

In step ST57, the memory controller 30 refers to the codebook 23 and acquires an index IDxmin corresponding to the xmin determined in step ST56 as a new representative index.

In this manner, the acquisition processing of the new representative index is completed.

2.3.2 Second Example

Next, a description will be given of a second example of the acquisition processing of the new representative index. In the second example, the absolute value of the difference between a new representative correction amounts and a correction amount in the codebook 23 is weighted for each read level and the sum of weighted absolute values is used as an evaluation value. The memory controller 30 extracts an index that minimizes the evaluation value from the codebook 23 and acquires it as a new index.

Figure 20:
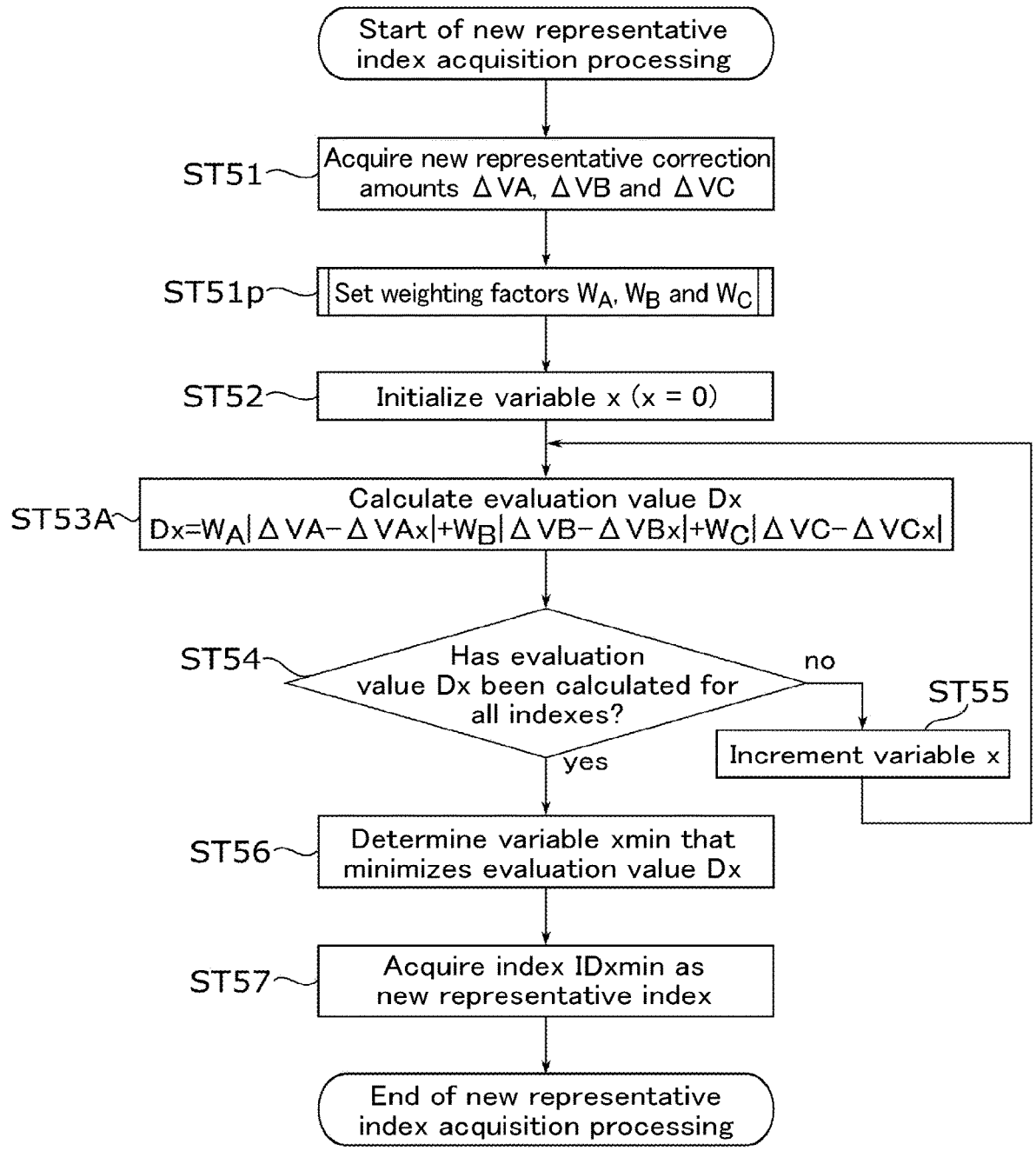
FIG. 20 is a flowchart illustrating a second example of the new representative index acquisition processing in the memory system according to the second embodiment.

FIG. 20 is a flowchart showing new representative index acquisition processing in the memory system according to the second embodiment, and corresponds to FIG. 19. In the description set forth below, reference will be made mainly to the processing different from that shown in FIG. 19.

As shown in FIG. 20, in step ST51, the memory controller 30 acquires new representative correction amounts ΔVA, ΔVB and ΔVC calculated in step ST15 shown in FIG. 18.

In step ST51p, the memory controller 30 sets weighting factors $W_A$, $W_B$ and $W_C$. The weighting factors $W_A$ to $W_C$ may be predetermined constants or may be adaptively set for each new representative index acquisition processing. Details of the weighting factor setting calculation executed when the weighting factors $W_A$ to $W_C$ are adaptively set for each new representative index acquisition processing will be described later.

In step ST52, the memory controller 30 initializes the variable x to "0" (x=0).

In step ST53A, the memory controller 30 calculates an evaluation value Dx expressed in the following equation, based on the new representative correction amounts ΔVA to ΔVC, the weighting factors $W_A$ to $W_C$, and the correction amounts ΔVAx to ΔVCx corresponding to the index IDx of the codebook 23.

$$Dx=W_A|\Delta VA-\Delta VAx|+W_B|\Delta VB-\Delta VBx|+W_C|\Delta VC-\Delta VCx|$$

Since the processing executed in steps ST54 to ST57 is similar to the processing executed in steps ST54 to ST57 shown in in FIG. 19, a description thereof will be omitted.

In this manner, the acquisition processing of the new representative index is completed.

Figure 21:
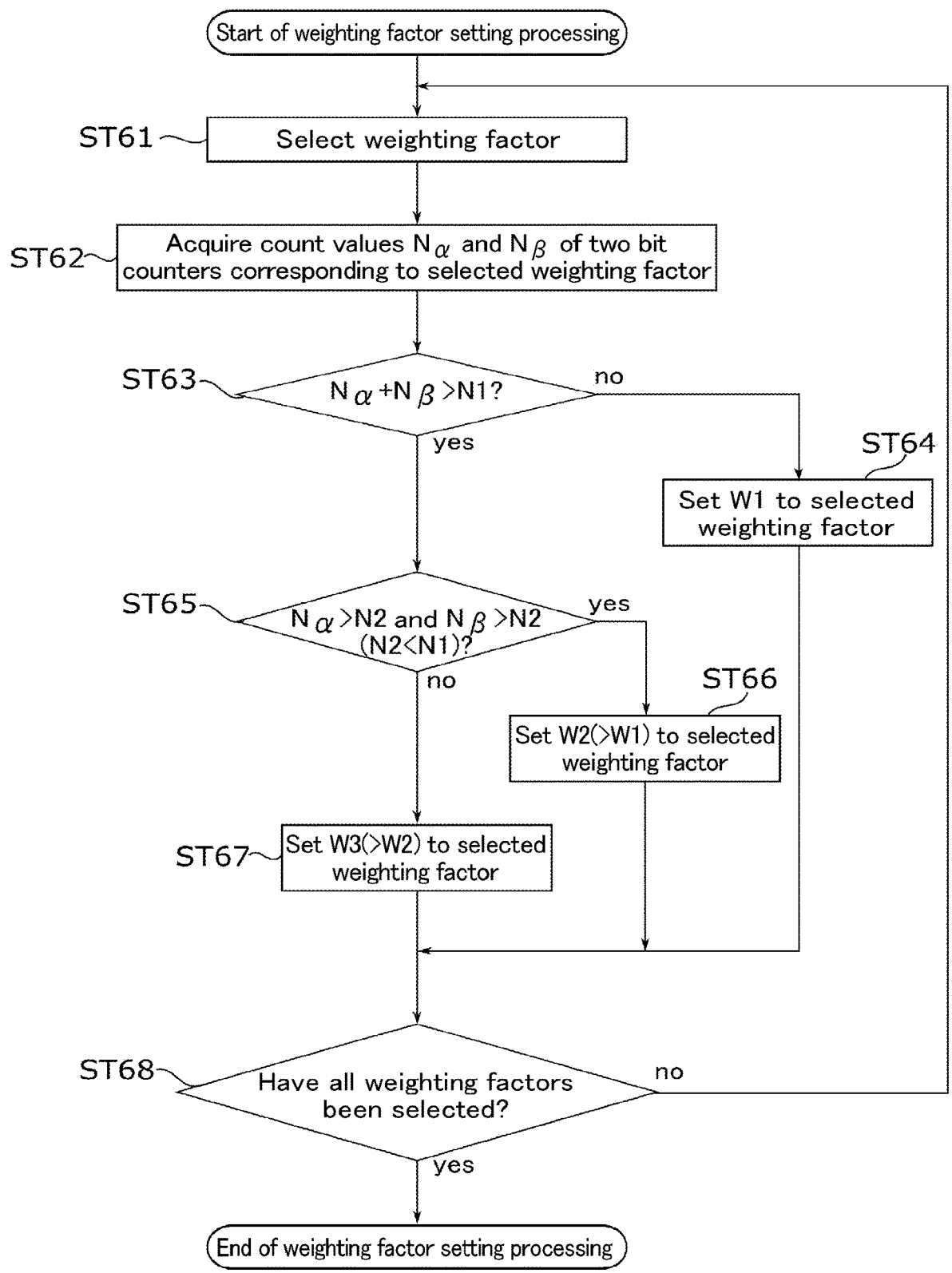
FIG. 21 is a flowchart illustrating weighting factor setting processing in the memory system according to the second embodiment.

FIG. 21 is a flowchart showing weighting factor setting processing in the memory system according to the second embodiment, and the flowchart corresponds to step ST51p shown in FIG. 20. FIG. 21 shows a case where a weighting factor is set based on the ratio of the number of error bits counted by the bit counter 64, as an example of the processing of dynamically setting the weighting factor.

As shown in FIG. 21, in step ST61, the memory controller 30 selects a weighting factor from $W_A$ to $W_C$.

In step ST62, the memory controller 30 acquires count values $N_\alpha$ and $N_\beta$ of the two bit counters 64 corresponding to the weighting factor selected in step ST61. Specifically, for example, where the weighting factor $W_A$ corresponding to the read voltage VA is selected, the memory controller 30 acquires the count values of the bit counters 64-1 and 64-2 as count values $N_\alpha$ and $N_\beta$, respectively. Where the weighting factor $W_B$ corresponding to the read voltage VB is selected, the memory controller 30 acquires the count values of the bit counters 64-3 and 64-4 as count values $N_\alpha$ and $N_\beta$, respectively. Where the weighting factor $W_C$ corresponding to the read voltage VC is selected, the memory controller 30 acquires the count values of the bit counters 64-5 and 64-6 as count values $N_\alpha$ and $N_\beta$, respectively.

In step ST63, the memory controller 30 determines whether or not the sum of the count values $N_\alpha$ and $N_\beta$ is greater than the threshold value N1. The threshold value N1 is 200, for example.

Where the sum of the count values $N_\alpha$ and $N_\beta$ is equal to or less than the threshold value N1 (no in step ST63), the process proceeds to step ST64. In step ST64, the memory controller 30 sets W1 to the selected weighting factor. The weighting factor W1 is 10, for example. After the processing in step ST64, the process proceeds to step ST68.

Where the sum of the count values $N_\alpha$ and $N_\beta$ is greater than the threshold value N1 (yes in ST63), the process proceeds to step ST65. In step ST65, the memory controller 30 determines whether or not each of the count values $N_\alpha$ and $N_\beta$ is greater than the threshold value N2. The threshold value N2 is a value smaller than the threshold value N1, and is 110, for example.

Where each of the count values $N_\alpha$ and $N_\beta$ is greater than the threshold value N2 (yes in ST65), the process proceeds to step ST66. In step ST66, the memory controller 30 sets W2 to the selected weighting factor. The weighting factor W2 is greater than the weighting factor W1, and is 50, for example. After the processing in step ST66, the process proceeds to step ST68.

Where either of the count values $N_\alpha$ and $N_\beta$ is equal to or less than the threshold value N2 (no in step ST65), the process proceeds to step ST67. In step ST67, the memory controller 30 sets W3 to the selected weighting factor. The weighting factor W3 is greater than the weighting factor W2, and is 100, for example. After the processing in step ST67, the process proceeds to step ST68.

In step ST68, the memory controller 30 determines whether or not all weighting factors have been selected. Where there is a weighting factor that is not selected (no in step ST68), the process returns to step ST61. Steps ST61 to ST68 are repeated until all weighting factors are selected.

When all weighting factors are selected (yes in step ST68), the weighting factor setting processing is ended.

By the operation described above, a large weighting factor can be set according to the size of the overlapping region of the adjacent threshold voltage distributions and the size of the overlapping bias of the adjacent threshold voltage distributions.

Although some examples of the new representative index acquisition processing have been described above, the above-mentioned examples are merely examples and are not restrictive.

2.4 Host Read Processing

Next, a description will be give of host read processing executed in the memory system according to the second embodiment.

Figure 22:
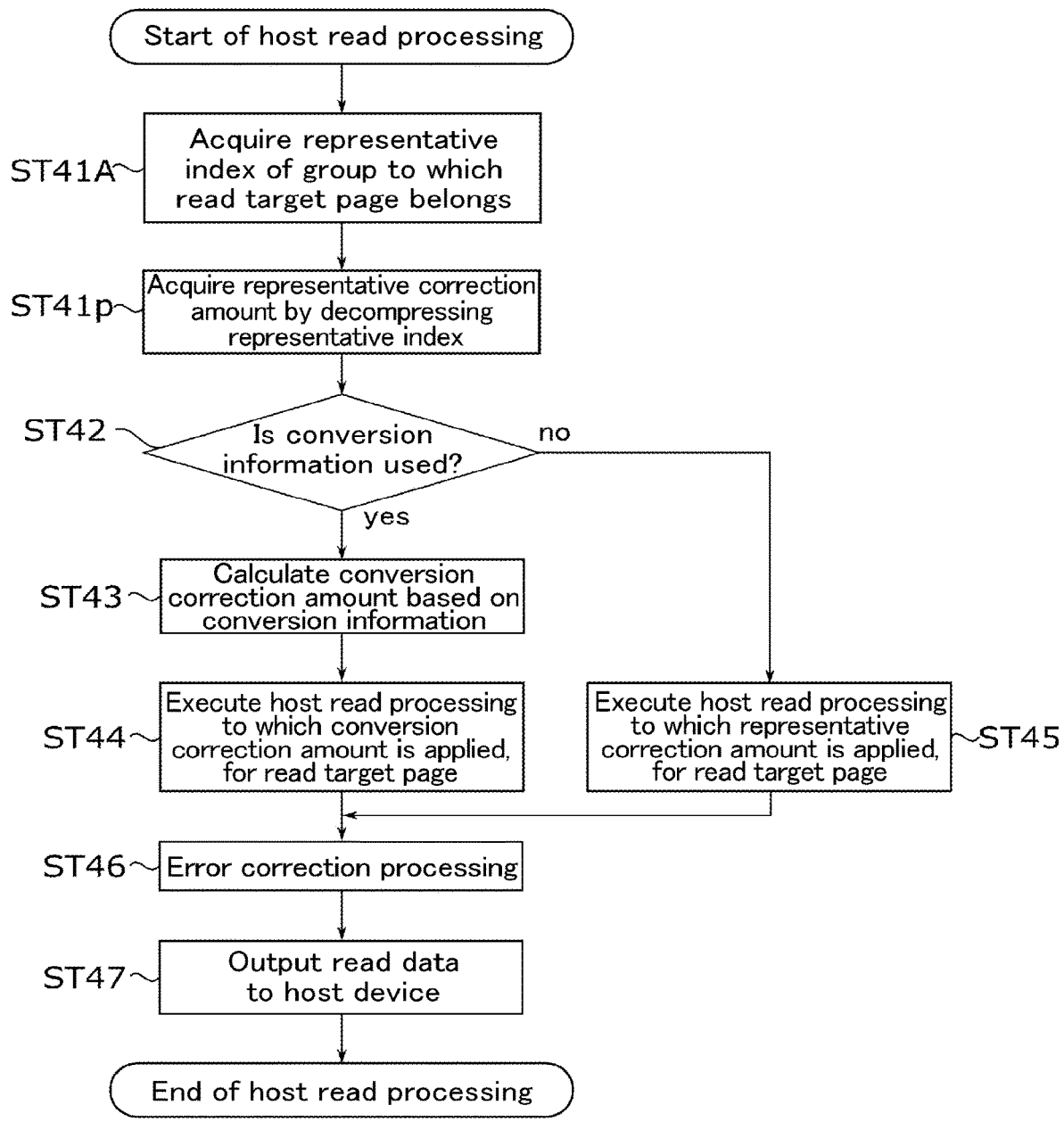
FIG. 22 is a flowchart illustrating host read processing in the memory system according to the second embodiment.

FIG. 22 is a flowchart showing host read processing in the memory system according to the second embodiment, and corresponds to FIG. 14 of the first embodiment. In FIG. 2.2, step ST41A is executed in place of steps ST41 shown in FIG. 14, and step ST41p is executed between steps ST41A and ST42.

As shown in FIG. 22, in step ST41A, upon receiving a read request from the host device 2, the memory controller 30 refers to the representative index information 21A in response to the read request, and acquires a representative index of the group Gr to which a read target page belongs.

In step ST41p, the memory controller 30 acquires a representative correction amount by decompressing the representative index acquired in step ST41A based on the codebook 23.

In steps ST42 to ST47, the memory controller 30 determines a correction amount to be used for the host read processing, based on the representative correction amount, and outputs the data read from the NAND flash memory 10 to the host device 2, using that correction amount. Since steps ST42 to ST47 are similar to steps ST42 to ST47 shown in FIG. 14, a description thereof will be omitted.

By the operation described above, the host read processing is completed.

2.5 Advantages of Present Embodiment

According to the second embodiment, the representative index information 21A stores the representative index for each group Gr. The codebook 23 stores an index and a correction amount in association with each other. At the time of patrol processing, the memory controller 30 executes the patrol read processing, using the representative correction amount obtained by decompressing the representative index, and calculates a new representative correction amount. Then, the memory controller 30 updates the representative index to a new representative index obtained by compressing the new representative correction amount. At the time of host read processing, the memory controller 30 determines a correction amount used for the host read processing, based on the representative correction amount obtained by decompressing the representative index associated with the group Gr to which the read target page belongs. As a result, the capacity required for storing the representative correction amount for each group Gr is suppressed to the capacity required for the representative index information 21A and the codebook 23, and yet an appropriate correction amount can be applied to each cell unit CU of each group Gr during the patrol processing and the host read processing. Therefore, an increase in the memory capacity of the DRAM 20 can be suppressed while suppressing an increase in the number of error bits included in the read data.

To supplement the description, the representative correction amounts of some groups Gr in the NAND flash memory 10 can be equivalent values. In this case, the capacity required of the DRAM 20 can be reduced by storing the representative correction amounts having the equivalent values as compressed representative indexes rather than storing the representative correction amounts for respective groups Gr. Therefore, it is possible to suppress an increase in the load of the memory system 1 due to the patrol processing.

3. Third Embodiment

Next, a description will be given of a memory system according to the third embodiment. According to the third embodiment, where the number of error bits of data read in the host read processing to which a first candidate of a conversion correction amount is applied is large, the host read processing to which a second candidate of the conversion correction amount is applied is executed. In this respect, the third embodiment differs from the first embodiment and the second embodiment. In the description set forth below, the configuration and operation similar to those of the second embodiment will not be mentioned, and the configuration and operation different from those of the second embodiment will be mainly mentioned.

3.1 Host Read Processing

Figure 23:
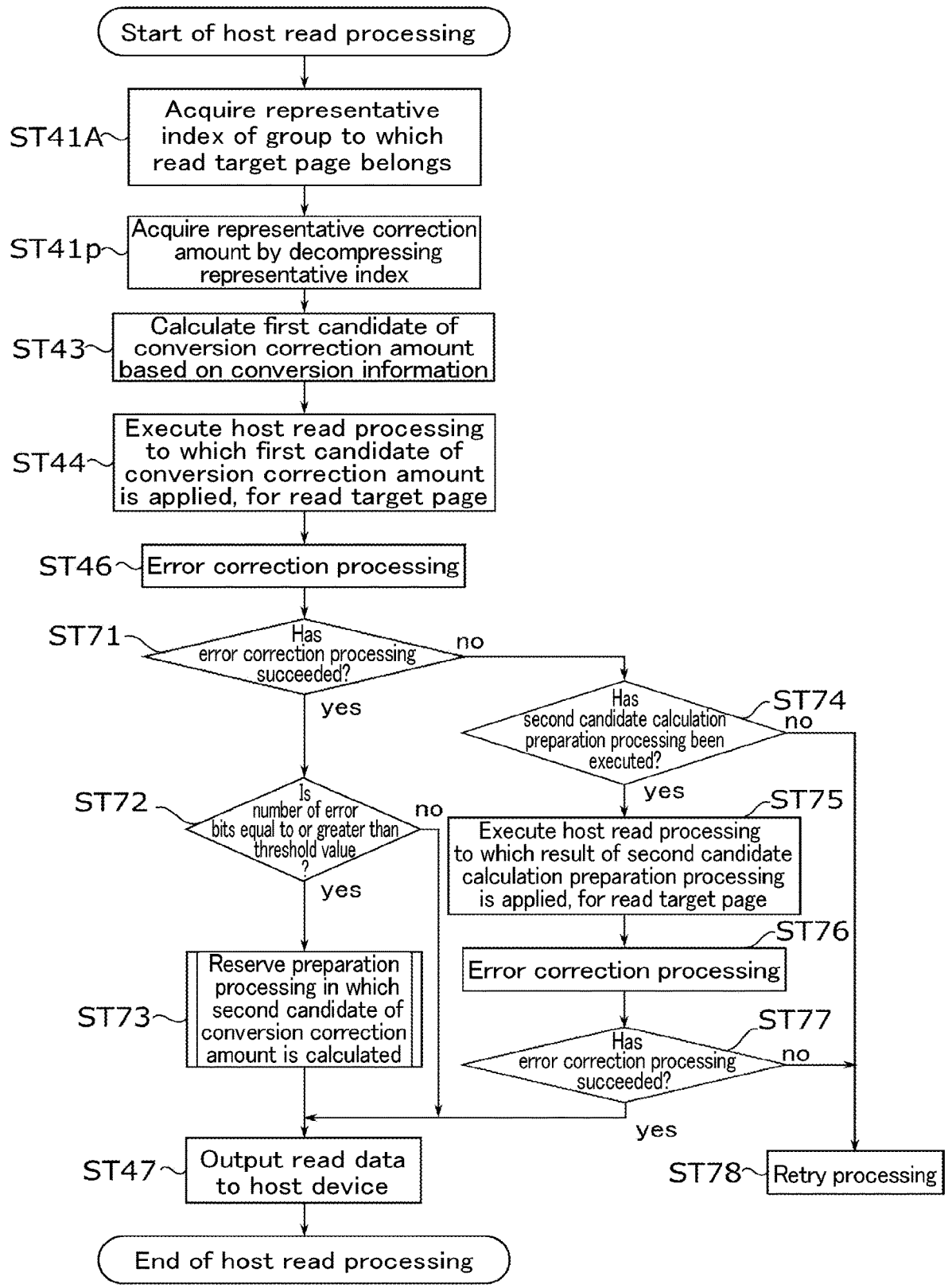
FIG. 23 is a flowchart illustrating host read processing in a memory system according to a third embodiment.

FIG. 23 is a flowchart showing host read processing in the memory system according to the third embodiment, and corresponds to FIG. 22 of the second embodiment. In FIG. 23, steps ST71 to ST78 are executed between step ST46 and step ST47. In FIG. 23, steps ST42 and ST45 are omitted for the convenience of description. That is, FIG. 23 shows host read processing executed using the conversion information 22.

As shown in FIG. 23, in steps ST41A to ST46, error correction processing is executed for the uncorrected page read from a read target page, using a conversion correction amount. Since steps ST41A to ST46 are similar to steps ST41A to ST46 shown in FIG. 22, a description thereof will be omitted. For the convenience of description, the conversion correction amount calculated in step ST43 and applied to the host read processing in step ST44 will be referred to as the first candidate of the conversion correction amount.

In step ST71, the memory controller 30 determines whether or not the error correction processing in step ST46 is successfully executed (that is, whether or not all error bits included in the uncorrected data could be corrected).

Where the error correction processing in step ST46 is successfully executed (yes in step ST71), the process proceeds to step ST72. In step ST72, the memory controller 30 determines whether or not the number of error bits corrected by the error correction process is equal to or greater than the threshold value. Where the number of error bits is equal to or greater than the threshold value (yes in step ST72), the memory controller 30 reserves, for example, execution of preparation processing in which a second candidate of the conversion correction amount (second candidate calculation preparation processing) is calculated for the cell unit CU including a read target page (a target cell unit for calculating the second candidate) (step ST73). After step ST73, the process proceeds to step ST47.

The second candidate calculation preparation processing changes the first candidate of parameters, such as conversion information, a codebook and representative index, etc. that are applied to calculate the first candidate of the conversion correction amount, to the second candidate of parameters. By this processing, the correction amount is made closer to an appropriate value and the number of error bits contained in uncorrected data is reduced. The applicable range of the second candidate calculation preparation processing can be freely set, but includes at least the group Gr to which the second candidate calculation preparation processing target cell unit CU belongs. The reserved second candidate calculation preparation processing is executed at any time regardless of the output timing of read data to the host device 2 in step ST47. For example, the reserved second candidate calculation preparation processing is executed at any time after the output of the read data to the host device 2 in step ST47. Details of the second candidate calculation preparation processing will be described later.

On the other hand, where the error correction processing in step ST46 ends in failure (no in step ST71), the process proceeds to step ST74. In step ST74, the memory controller 30 determines whether or not the second candidate calculation preparation processing applicable to the group Gr to which the read target page belongs has been executed. As described above, the applicable range of the second candidate calculation preparation processing includes at least the group Gr to which the second candidate calculation preparation processing target cell unit CU belongs. Therefore, even where the second candidate calculation preparation processing is not executed in the cell unit CU to which the read target page belongs, it can be determined that the second candidate calculation preparation processing has been executed as long as it is executed in another cell unit CU of the same group Gr.

Where the second candidate calculation preparation processing has been executed (yes in step ST74), the process proceeds to step ST75, and where the second candidate calculation preparation processing has not been executed (no in step ST74), the process proceeds to step ST78.

In step T75, the memory controller 30 applies the result of the second candidate calculation preparation processing and executes the host read processing for the read target page. As a result, the host read processing to which a correction amount different from that of step ST44 is applied is executed.

In step ST76, the ECC circuit 34 of the memory controller 30 executes error correction processing on the data read in step ST75. Thereby, an error contained in the read data is corrected.

In step ST77, the memory controller 30 determines whether or not the error correction processing in step ST76 is successfully executed. Where the error correction processing in step ST76 is successfully executed (yes in step ST77), the process proceeds to step ST47, and where the error correction processing in step ST76 ends in failure (no in step ST77), the process proceeds to step ST78.

In step ST78, the memory controller 30 executes retry processing. The retry processing is, for example, processing of executing a plurality of read processes in order to recover data for which the error correction processing ends in failure. In the retry processing, soft bit decoding or the like can be executed based on a plurality of read data read by using different read voltages for the plurality of read processes.

In step ST47, the memory controller 30 outputs the read data subjected to error correction to the host device 2.

In this manner, the host read processing is completed.

In the example shown in FIG. 23, reference was made to the case where the host read processing is first executed by applying the first candidate of the conversion correction amount and then the host read processing is executed by applying the second candidate of the conversion correction amount. However, this case is not restrictive. For example, the memory controller 30 may execute both the host read processing to which the first candidate of the conversion correction amount is applied and the host read processing to which the second candidate of the conversion correction amount is applied, regardless of the success or failure of the error correction of the host read processing to which the first candidate of the conversion correction amount is applied.

3.2 Second Candidate Calculation Preparation Processing

Next, a description will be given of some examples of the second candidate calculation preparation processing executed in the memory system according to the third embodiment.

3.2.1 First Example (Change of Conversion Information)

First, a first example of the second candidate calculation preparation processing will be described. In the first example, the number of error bits can be reduced by changing the conversion information 22 from the first candidate to the second candidate.

Figure 24:
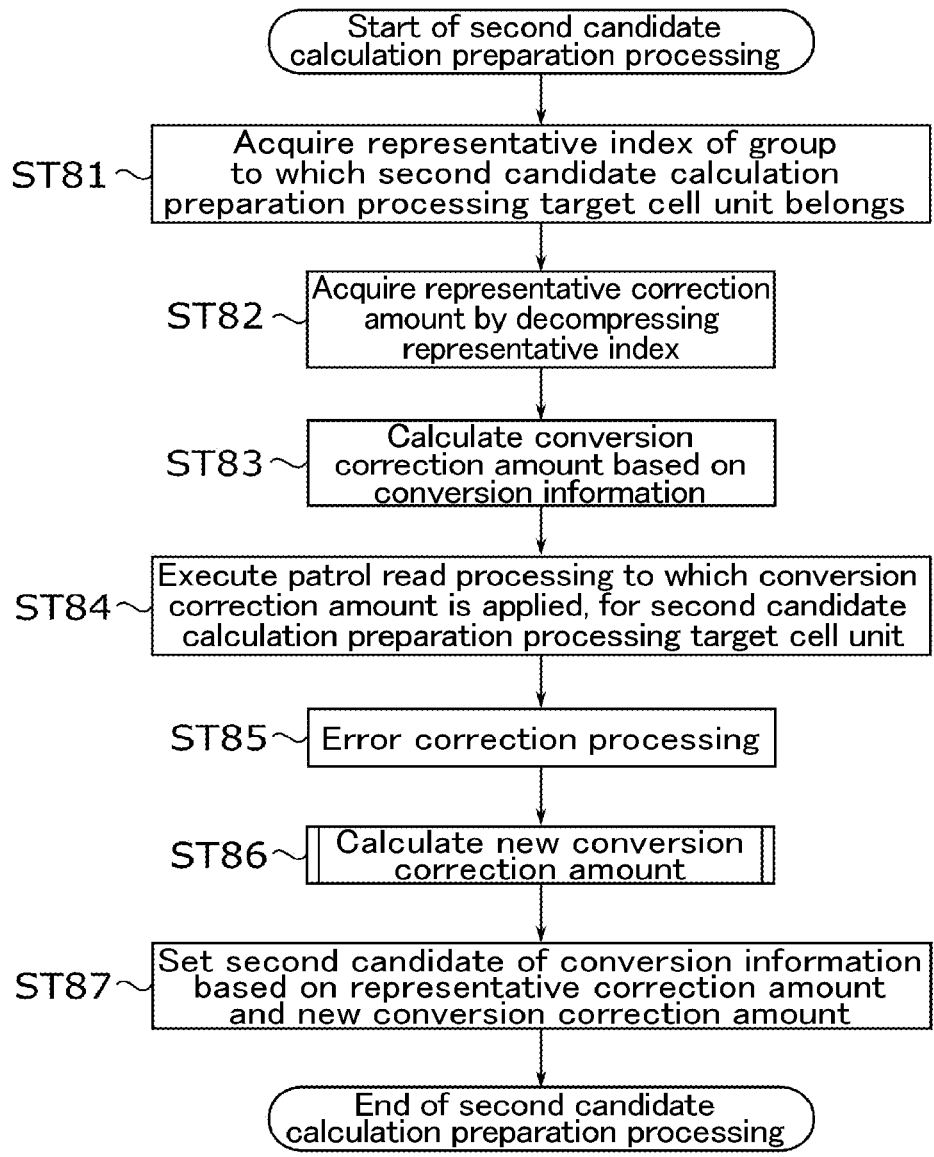
FIG. 24 is a flowchart illustrating a first example of second candidate calculation preparation processing in the memory system according to the third embodiment.

FIG. 24 is a flowchart showing the first example of the second candidate calculation preparation processing in the memory system according to the third embodiment.

As shown in FIG. 24, in step ST81, the memory controller 30 refers to the representative index information 21A and acquires a representative index of the group Gr to which the second candidate calculation preparation processing target cell unit CU belongs.

In step ST82, the memory controller 30 acquires a representative correction amount by decompressing the representative index acquired in step ST81 based on the codebook 23.

In step ST83, the memory controller 30 inputs information specifying each of the representative cell unit CU and the second candidate calculation preparation processing target cell unit CU and a representative correction amount to the conversion information 22, and obtains a conversion correction amount as an output. The conversion information 22 used in step ST83 is the first candidate of the conversion information.

In step ST84, the memory controller 30 executes patrol read processing to which the conversion correction amount acquired in step ST83 is applied for the second candidate calculation preparation processing target cell unit CU. Since the patrol read processing is similar to the patrol read processing executed in step ST13 of FIG. 18 of the second embodiment, except that the read target cell unit CU is different, a description thereof will be omitted.

In step ST85, the ECC circuit 34 of the memory controller 30 executes error detection processing on the uncorrected data acquired in step ST84. The ECC circuit 34 generates error position information including an error position specified by the error detection processing, and stores the error position information in the buffer memory 61.

In step ST86, the read voltage correction circuit 37 executes correction amount calculation processing and calculates a new conversion correction amount for the second candidate calculation preparation processing cell unit CU. Since the correction amount calculation processing is similar to the correction amount calculation processing executed in step ST15 of FIG. 18 of the second embodiment, except that the read target cell unit CU is different, a description thereof will be omitted.

In step ST87, the memory controller 30 sets conversion information 22 applied to the group Gr to which the second candidate calculation preparation processing target cell unit CU belongs, as the second candidate of the conversion information, based on the representative correction amount of the group Gr to which the second candidate calculation preparation processing target cell unit CU belongs and the new conversion correction amount calculated in step ST86.

By the operation described above, the second candidate calculation preparation processing is completed.

To supplement the description of step ST87, there may be a case where the conversion correction amount based on the first candidate of the conversion information is not an appropriate correction amount for the second candidate calculation preparation processing target cell unit CU, as in the case where the number of error bits is equal to or greater than the threshold value in step ST72 shown in FIG. 23. According to the first example, the memory controller 30 changes the first candidate of the conversion information to the second candidate of the conversion information that is proper for both a representative correction amount appropriate for the representative cell unit CU and a new conversion correction amount appropriate for the second candidate calculation preparation processing target cell unit CU. That is, the second candidate of the conversion information enables output of a new conversion correction amount by inputting the information specifying each of the representative cell unit CU and the second candidate calculation preparation processing target cell unit CU and the representative correction amount. Therefore, by executing the second candidate calculation preparation processing, the number of error bits of the data read by the host read processing executed in step ST75 of FIG. 23 can be reduced.

3.2.2 Second Example (Change of Codebook)

Next, a second example of the second candidate calculation preparation processing will be described. In the second example, the number of error bits can be reduced by changing the codebook 23.

Figure 25:
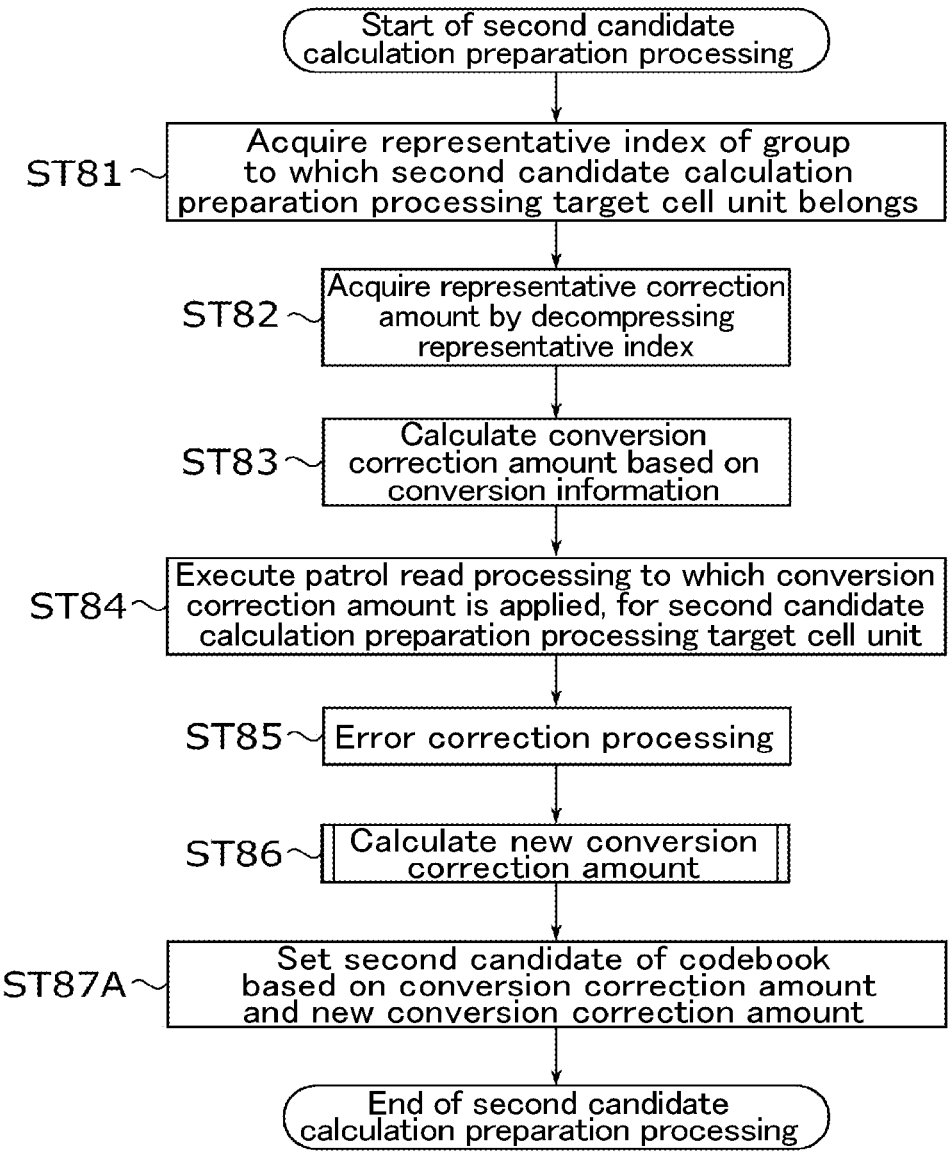
FIG. 25 is a flowchart illustrating a second example of the second candidate calculation preparation processing in the memory system according to the third embodiment.

FIG. 25 is a flowchart showing the second example of the second candidate calculation preparation processing in the memory system according to the third embodiment.

As shown in FIG. 25, in steps ST81 to ST86, the patrol read processing and the correction amount calculation processing are executed for the second candidate calculation preparation processing cell unit CU, and a new conversion correction amount is calculated thereby. Since steps ST81 to ST86 are similar to steps ST81 to ST86 shown in FIG. 24, a description thereof will be omitted. The codebook 23 used in step ST82 is the first candidate of the codebook.

In step ST87A, the memory controller 30 sets codebook 23 applied to the group Gr to which the second candidate calculation preparation processing target cell unit CU belongs as the second candidate of the codebook, based on the conversion correction amount calculated in step ST83 and the new conversion correction amount calculated in step ST86.

By the operation described above, the second candidate calculation preparation processing is completed.

To supplement the description of step ST87A, the difference between the conversion correction amount and the new conversion correction amount may be due to the error between the representative index and the representative correction amount caused by lossy compression. Specifically, for example, where the difference between the conversion correction amount $\Delta$VA and the new conversion correction amount $\Delta$VA is significantly large, that difference may be due to the error of the representative correction amount that is caused by the large step size of the correction amount $\Delta$VA between the indexes in the first candidate of the codebook. According to the second example, the memory controller 30 sets the second candidate of the codebook, based on the difference between a conversion correction amount inappropriate for the second candidate calculation preparation processing target cell unit CU and a new conversion correction amount appropriate for the second candidate calculation preparation processing target cell unit CU. That is, the second candidate of the codebook enables the error between the representative correction amount and the conversion amount associated with the representative correction amount caused by lossy compression to be reduced to such an extent that the conversion correction amount in step ST83 and the new conversion correction amount in step ST86 do not significantly differ from each other. Therefore, by executing the second candidate calculation preparation processing, reduction of the number of error bits of the data read by the host read processing executed in step ST75 of FIG. 23 can be expected.

3.2.3 Third Example (Change of Representative Index)

Next, a third example of the second candidate calculation preparation processing will be described. In the third example, the number of error bits can be reduced by changing the representative index of the representative index information 21A.

Figure 26:
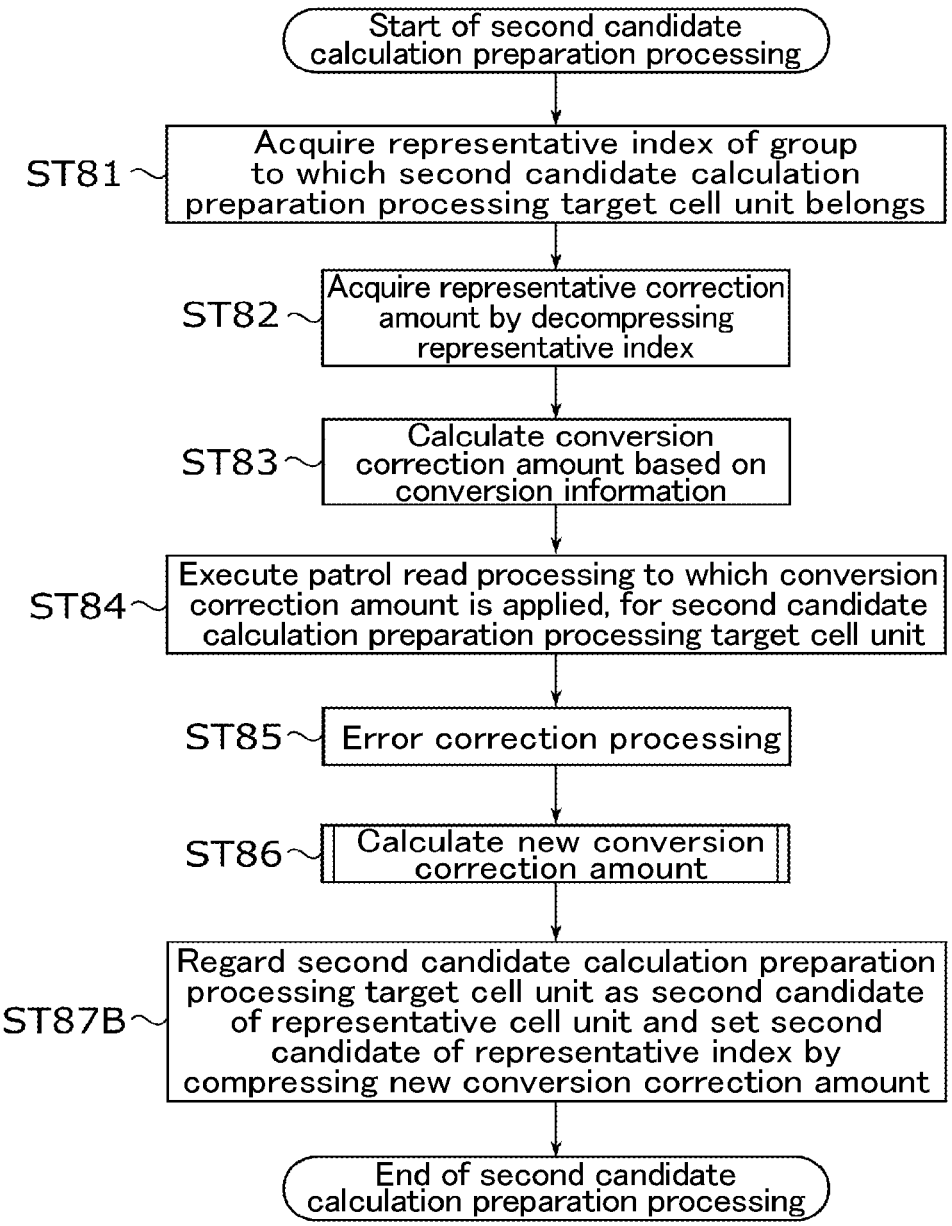
FIG. 26 is a flowchart illustrating a third example of the second candidate calculation preparation processing in the memory system according to the third embodiment.

FIG. 26 is a flowchart showing the third example of the second candidate calculation preparation processing in the memory system according to the third embodiment.

As shown in FIG. 26, in steps ST81 to ST86, the patrol read processing and the correction amount calculation processing are executed for the second candidate calculation preparation processing cell unit CU, and a new conversion correction amount is calculated. Since steps ST81 to ST86 are similar to steps ST81 to ST86 shown in FIG. 24 and FIG. 25, a description thereof will be omitted. The representative index used in step ST81 is the first candidate of the representative index.

In step ST87B, the memory controller 30 regards the second candidate calculation preparation processing target cell unit CU as the second candidate of the representative cell unit CU. That is, the memory controller 30 regards the new conversion correction amount calculated in step ST86 as the second candidate of the representative correction amount and acquires a second candidate of the representative index by compressing the new conversion correction amount. The acquired second candidate of the representative index is associated with the second candidate calculation preparation processing target cell unit CU (that is, the second candidate of the representative cell unit CU) and is stored in the representative index information 21A.

By the operation described above, the second candidate calculation preparation processing is completed.

To supplement the description of step ST87B, there may be a case where the error of the conversion correction amount on a read target page can be reduced by changing the representative index at the starting point of conversion with no need to change the conversion information 22 and the codebook 23. According to the third example, the memory controller 30 regards the second candidate calculation preparation processing target cell unit CU for which the new conversion correction amount is calculated as the second candidate of the representative cell unit CU. As a result, in the host read processing executed in step ST75 shown in FIG. 23, a second candidate of the representative correction amount different from the representative correction amount applied in the host read processing executed in step ST44 can be used. Therefore, it is possible to increase the possibility that the number of error bits of the data read from a read target page is reduced.

3.3 Advantages of Present Embodiment

According to the third embodiment, the memory controller 30 reserves execution of the second candidate calculation preparation processing where the number of error bits of the data read by the host read processing is equal to or greater than the threshold value. By executing the second candidate calculation preparation processing, the memory controller 30 changes at least one of the conversion information 22, codebook 23 and representative cell unit CU that are used for the host read processing in which the number of error bits exceeds the threshold value. As a result, the conversion correction amount used for the host read processing read from the read target page can be changed to a more appropriate value. Thus, the possibility of failure of the error correction processing can be reduced. Therefore, deterioration of the performance of the memory system 1 can be suppressed even where the threshold voltage fluctuates.

4. Modifications

The first to third embodiments described above are not limited to the above-mentioned examples, and various modifications can be applied.

4.1 First Modification

For example, in connection with the first to third embodiments described above, reference was made to the case where the number of representative correction amounts input to the conversion information 22 at the time of acquiring the conversion correction amount is one, but this is not restrictive. For example, the number of representative correction amounts input to the conversion information 22 may be two or more.

Figure 27:
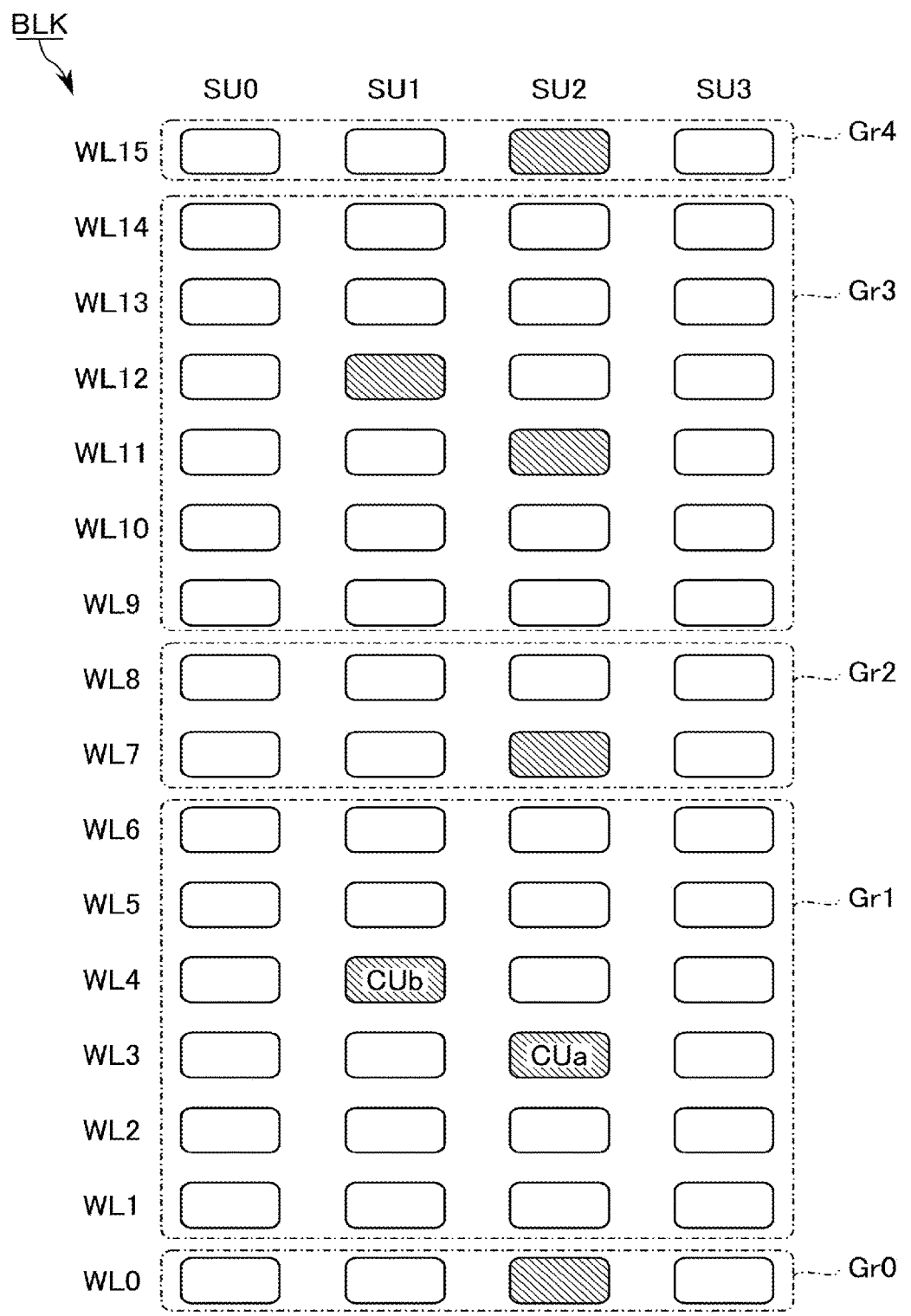
FIG. 27 is a schematic diagram illustrating representative cell units of a block according to a first modification.

FIG. 27 is a schematic view showing an example of grouping of the cell units in a block according to a first modification, and corresponds to FIG. 7 of the first embodiment.

As shown in FIG. 27, two representative cell units CU may be assigned to each group Gr. In FIG. 27, for example, in group Gr1, a cell unit CUa corresponding to the set of the string unit SU2 and the word line WL3 and a cell unit CUb corresponding to the set of the string unit SU1 and the word line WL4 are assigned as representative cell units CU.

In this case, in the patrol processing for the group Gr1, the representative correction amount of the cell unit CUa and the representative correction amount of the cell unit CUb are calculated and stored individually in the representative correction amount information 21. In the host read processing for the group Gr1, the two representative correction amounts are input to the conversion information 22, and one conversion correction amount is output.

As a result, the calculation accuracy of the conversion correction amount can be further improved.

4.2 Second Modification

In the first to third embodiments described above, reference was made to the case where the buffer memory 61 stores uncorrected data and error position information, but this is not restrictive. For example, the buffer memory 61 may store corrected data instead of the uncorrected data.

Figure 28:
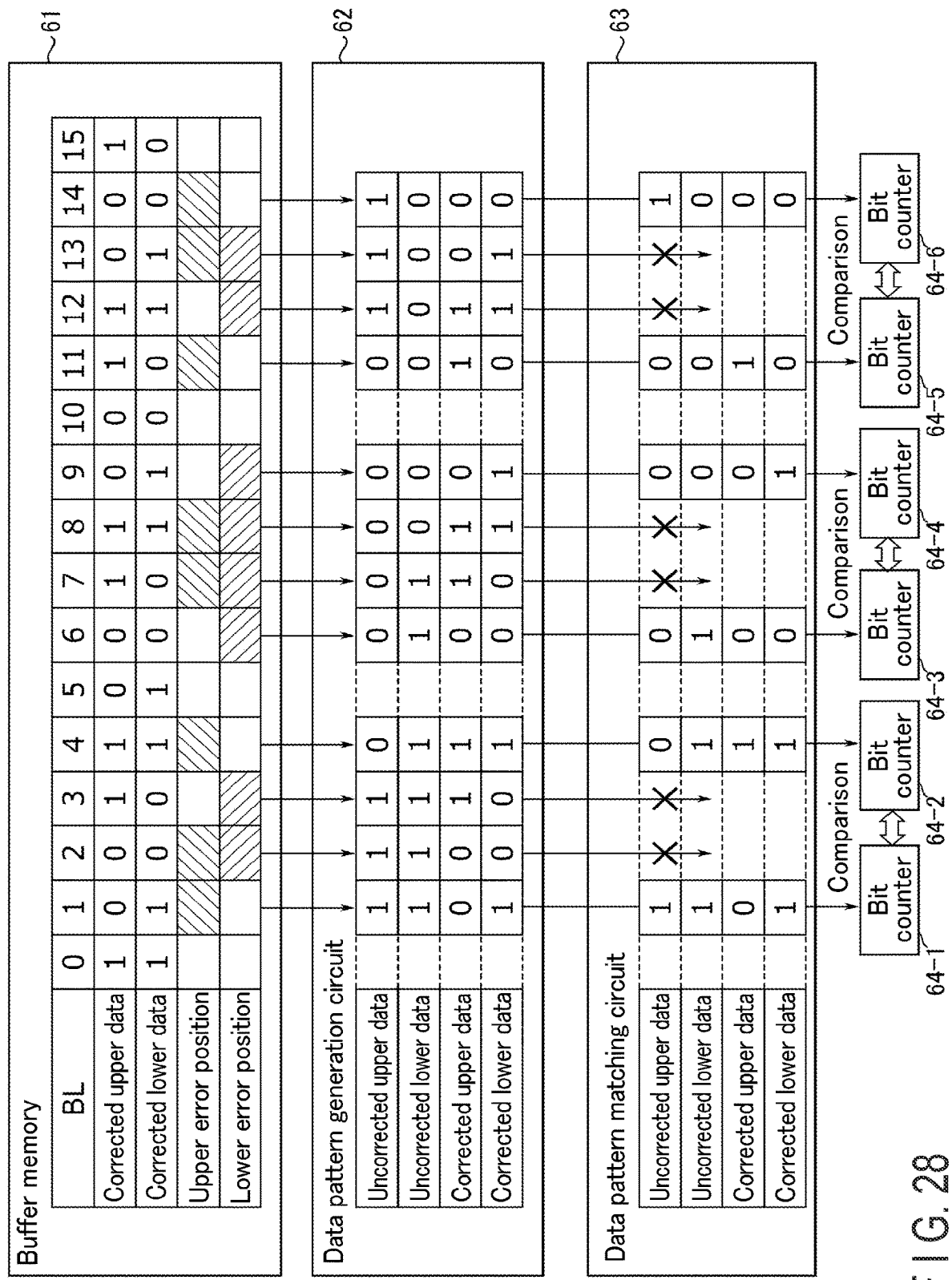
FIG. 28 is a schematic diagram illustrating correction amount calculation processing in a memory system according to a second modification.

FIG. 28 is a schematic diagram showing correction amount calculation processing in the memory system according to a second modification, and corresponds to FIG. 12 of the first embodiment. Similar to FIG. 12, FIG. 28 is just an example, and the correspondence between data pattern and the error position is not limited to this example, and there are various cases.

As shown in FIG. 28, the ECC circuit 34 generates error position information and corrected data by executing error detection processing and error correction processing, respectively, and stores them in the buffer memory 61. After the error correction processing by the ECC circuit 34, the uncorrected data is discarded without being stored in the buffer memory 61.

The data pattern generation circuit 62 recognizes that the corrected data "01" of the column address CADD1 is generated by correcting the error of the upper bit. Thus, the data pattern generation circuit 62 generates data pattern "1101" for the column address CADD1. Likewise, the data pattern generation circuit 62 generates data patterns "1100", "1110", "0111", "0100", "0110", "0011", "0001", "0010", "1011", "1001", and "1000" for the column addresses CADD2 to CADD4, CADD6 to CADD9 and CADD11 to CADD14, respectively.

As described above, even where the corrected data is used instead of the uncorrected data, the buffer memory 61, which has the same memory size as the case the uncorrected data is used, can execute correction amount calculation processing similarly to the case where the uncorrected data is used.

4.3 Others

In connection with the first to third embodiments described above, reference was made to the case where 2-bit data can be stored in one memory cell transistor MT. However, this is not restrictive and data of 3 bits, 4 bits, 5 bits or more can be stored in one memory cell transistor MT. Where the number of bits of data that can be stored in the memory cell transistor MT is n bits, the number of threshold voltage distributions is $2^n$. Therefore, the number of bit counters 64 provided is $(2^n-1)\times 2$ according to the number of threshold voltage distributions.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory system comprising:
   a nonvolatile memory including a plurality of cell units, each of the plurality of cell units including a plurality of memory cells; and
   a memory controller,
   wherein the memory controller is configured to:
   read first data from a first cell unit, using a first correction amount of a read voltage;
   identify an address of an error bit in the first data;
   update the first correction amount to a second correction amount, based on the first data and the address of the error bit of the first data; and
   read second data from a second cell unit different from the first cell unit, using a third correction amount based on the second correction amount.

2. The memory system of claim 1, wherein the third correction amount is equal to the second correction amount.

3. The memory system of claim 2, wherein the nonvolatile memory includes a plurality of groups each including the plurality of cell units, and
   the memory controller is configured to read third data from a third cell unit of a first group of the plurality of groups by using the third correction amount, the first group including both the first cell unit and the second cell unit.

4. The memory system of claim 1, wherein the third correction amount is different from the second correction amount.

5. The memory system of claim 4, wherein the nonvolatile memory includes a plurality of groups each including the plurality of cell units,
   the memory controller is configured to read third data from a third cell unit of a first group including both the first cell unit and the second cell unit, by using a fourth correction amount based on the second correction amount, and
   the fourth correction amount is different from the second correction amount and the third correction amount.

6. The memory system of claim 5, wherein the memory controller is configured to:
   convert the second correction amount into the third correction amount, based on an address of the first cell unit and an address of the second cell unit; and
   convert the second correction amount into the fourth correction amount, based on the address of the first cell unit and an address of the third cell unit.

7. The memory system of claim 5, wherein the memory controller is configured to:
   read fourth data from a fourth cell unit, using a fifth correction amount of a read voltage;
   identify an address of an error bit in the fourth data;
   update the fifth correction amount to a sixth correction amount, based on the fourth data and the address of the error bit of the fourth data; and
   read fifth data from a fifth cell unit different from the fourth cell unit, using the sixth correction amount, and
   the fourth cell unit and the fifth cell unit are included in a second group different from the first group.

8. The memory system of claim 7, wherein the memory controller is configured to:
   read sixth data from a sixth cell unit, using a seventh correction amount of a read voltage;
   identify an address of an error bit in the sixth data;
   update the seventh correction amount to an eighth correction amount, based on the sixth data and the address of the error bit in the sixth data; and
   read the second data from the second cell unit, using a ninth correction amount based on the second correction amount and the eighth correction amount.

9. The memory system of claim 1, wherein the memory controller is configured to:
   store a first codebook that associates a correction amount with an index whose data size is smaller than the correction amount;
   acquire the first correction amount by decompressing a first index, based on the first codebook; and
   acquire a second index by compressing the second correction amount, based on the first codebook, and
   updating the first correction amount to the second correction amount includes updating the first index to the second index.

10. The memory system of claim 6, wherein, when a number of error bits included in the second data is equal to or greater than a threshold value, the memory controller is configured to:
    identify an address of an error bit in the second data;
    update the third correction amount to a tenth correction amount, based on the second data and the address of the error bit of the second data; and
    change information used for conversion of the second correction amount based on the address of the first cell unit and the address of the second cell unit from first information to second information, the first information converting the second correction amount to the third correction amount, the second information converting the second correction amount to the tenth correction amount.

11. The memory system of claim 9, wherein, where when a number of error bits included in the second data is equal to or greater than a threshold value, the memory controller is configured to:
    identify an address of an error bit in the second data;
    update the third correction amount to a tenth correction amount, based on the second data and the address of the error bit in the second data; and
    change the first codebook to a second codebook, based on a difference between the third correction amount and the tenth correction amount.

12. The memory system of claim 1, wherein, when a number of error bits included in the second data is equal to or greater than a threshold value, the memory controller is configured to:
    identify an address of an error bit in the second data;
    update the third correction amount to a tenth correction amount, based on the second data and the address of the error bit of the second data; and
    read seventh data from a seventh cell unit different from the second cell unit, using an eleventh correction amount based on the tenth correction amount.

13. The memory system of claim 7, wherein the nonvolatile memory includes a plurality of blocks each including the plurality of groups, and
    each of the plurality of blocks is a data erase unit.

14. The memory system of claim 13, wherein each of the plurality of cell units is a data write unit.

15. The memory system of claim 13, wherein the plurality of memory cells of one of the plurality of cell units are commonly coupled to one word line, and are coupled to different bit lines.

* * * * *